(12) United States Patent
Matsuhashi et al.

(10) Patent No.: US 6,833,589 B2
(45) Date of Patent: Dec. 21, 2004

(54) METHOD FOR MANUFACTURING FIELD EFFECT TRANSISTOR

(75) Inventors: Hideaki Matsuhashi, Saitama (JP); Yoko Kajita, Tokyo (JP); Yoshihiro Koga, Tokyo (JP); Toshiyuki Nakamura, Tokyo (JP); Jun Kanamori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 196 days.

(21) Appl. No.: 10/075,588

(22) Filed: Feb. 15, 2002

(65) Prior Publication Data

US 2003/0049940 A1 Mar. 13, 2003

(30) Foreign Application Priority Data

Sep. 10, 2001 (JP) ........................................ 2001-273731

(51) Int. Cl.[7] ...................... H01L 29/360; H01L 29/380
(52) U.S. Cl. ...................... 257/350; 257/351; 438/224; 438/225; 438/226
(58) Field of Search ................................ 438/224–226; 257/347, 349, 351, 353, 354

(56) References Cited

U.S. PATENT DOCUMENTS

| | | | | |
|---|---|---|---|---|
| 5,218,217 A | * | 6/1993 | Oda et al. | 257/296 |
| 5,331,193 A | * | 7/1994 | Mukogawa | 257/371 |
| 6,025,629 A | * | 2/2000 | Ipposhi et al. | 257/347 |
| 6,380,053 B1 | * | 4/2002 | Komatsu | 438/517 |
| 2001/0019155 A1 | * | 9/2001 | Warashina et al. | 257/351 |

OTHER PUBLICATIONS

Terukazu Ohno et al., "Experimental 0.25–um–Gate Fully Depleted CMOS/SIMOX Process Using a New Two–Step LOCOS Isolation Technique," IEE Transactions on Electron Devices, vol. 42, No. 8, Aug. 1995.

T. Naka et al., "A 0.35um Shallow SIMOX/CMOS Technology for Low–Power, High–Speed Applications," The Institute of Electronics, Information and Communication Engineers, Technical Report of IEICE (Mar. 1993), p. 45–52.

* cited by examiner

*Primary Examiner*—Duy-Vu Deo
(74) *Attorney, Agent, or Firm*—Volentine Francos, PLLC

(57) ABSTRACT

A field oxide film for element isolation is formed on an SOI substrate having a silicon layer formed on an insulating layer, an active nitride film is wet-etched to reduce its film thickness to a value small enough to allow the edge of the silicon layer to become exposed and ions of a channel stopping impurity are implanted only into the edge of the silicon layer through self-alignment either vertically or at an angle by using the active nitride film as a mask. Through this manufacturing method, a field effect transistor which achieves a small gate length, is free from the adverse effect of a parasitic transistor and thus does not readily manifest a hump, and allows a reduction in the distance between an nMOS and a pMOS provided next to each other is realized.

14 Claims, 31 Drawing Sheets

METHOD FOR MANUFACTURING FIELD EFFECT TRANSISTOR

BACKGROUND OF THE INVENTION

1. Field of the Invention

The present invention relates to a method for manufacturing a field effect transistor (MOSFET: MOS Field Effect Transistor) having a very small gate length, which is achieved by using an SOI (silicon-on-insulator) substrate with a silicon layer formed on an insulating layer.

2. Description of the Related Art

An SOI substrate is constituted of an insulating layer and a silicon layer formed on the insulating layer. The structural features of the SOI MOSFET manufactured by using such an SOI substrate achieve advantages of a small parasitic capacitance, being latch-up free, a low soft error rate, relative ease in element isolation and the like. For this reason, an SOI MOSFET is considered to be ideal in application in a high-speed, low power consumption LSI.

In particular, since a depletion layer formed under a gate reaches a buried oxide film (BOX) under the SOI in a fully depleted (FD) device, the depletion layer capacitance can be reduced in the fully depleted device. Thus, an advantage is achieved in that the sub-threshold slope can be reduced to a value very close to the ideal value.

The SOI MOSFET manufacturing methods in the related art include the SOI nMOSFET manufacturing method disclosed in "T, Ohno et al., IEEE Trans. On Electron Devices, 42, p.1481, 1995" (hereafter referred to as the "first related art method"). In the first related art method, a field oxide film for element isolation is first formed on an SIMOX (Separation by Implanted Oxygen) substrate achieved by forming a buried oxide film and a silicon layer on a silicon substrate at 100 nm and 56 nm respectively. Next, boron fluoride ($BF_2$) ions are implanted into a body area enclosed by the field oxide film until a concentration of approximately $10^{17}$ cm$^{-3}$ is achieved. Then, ions of an impurity, i.e., $BF_2$, are implanted for channel stopping at the edge of the body area. As a result, a higher density is achieved at the edge of the silicon layer.

In the next step, a gate oxide film is formed over a thickness of 7 nm on the body area. Then, $N^+$ polysilicon is formed over a 30 nm thickness on the gate oxide film and the area ranging from one side of the field area through the center of the body area to the opposite side of the field area is patterned to form a gate electrode having a gate length of approximately 0.25 $\mu$m.

In the following step, a silicon nitride (SiN) film and an $N^+$ polysilicon film are formed at the side surface of the gate electrode constituted of the $N^+$ polysilicon and a sidewall constituted of the SiN film and the $N^+$ polysilicon film are formed through sidewall etching.

Then, phosphorus (P) is injected into the edge of the silicon layer through ion implantation to form a source drain area.

Next, after removing the $N^+$ polysilicon film alone through wet-etching from the sidewall thereby achieving a sidewall exclusively constituted of the SiN film, a rapid thermal annealing treatment (RTA; rapid thermal anneal) is performed at 1000° C. in order to activate the impurities.

A fully depleted SOI field effect transistor (MOSFET) achieving a very small gate length is manufactured through the first related art method as described above. In the first related art method, the threshold voltage (Vth) of the parasitic transistor formed at the edge of the body area is raised by implanting channel-stopping ions, and thus, a reduction in the off-leak current attributable to the occurrence of a hump is attempted.

Another SOI MOSFET manufacturing method in the related art is disclosed in "Naka et al. Shingaku Giho, SDM 96-234, p.45, 1997" (hereafter referred to as the "second related art method").

The second related art method utilizes an SIMOX wafer achieved by forming a buried oxide film and a silicon layer over 100 nm and 55 nm respectively on a silicon substrate. A field oxide film for element isolation is formed first. Next, boron fluoride ($BF_2$) and phosphorus (P) are injected into two body areas to constitute an nMOS and a pMOS through ion implantation to a concentration achieving a threshold voltage of 0.2~0.3 V.

Then, a gate oxide film is formed over a thickness of 7 nm on the two body areas. A non-doped polysilicon is formed over a thickness of 200 nm on the gate oxide film and then a gate electrode having a gate length of approximately 0.35 $\mu$m are formed through patterning.

In the following step, a sidewall constituted of a silicon oxide ($SiO_2$) film is formed at part of each body area, and then P and $BF_2$ are injected into the nMOS area and the pMOS area through ion implantation. A single drain of the n MOSFET and pMOSFET are formed as a result. At the same time, an impurity is doped at each gate electrode. As a result, an $N^+$ polysilicon gate electrode and a $P^+$ polysilicon gate electrode are formed respectively at the nMOS area and the pMOS area.

In the next step, furnace annealing is performed at 800° C. and then an RTA is performed at 1000° C. to activate the impurities. Afterwards, a Ti silicide is formed on the source•drain and also on the gate through a Ti silicide process.

A fully depleted SOI field effect transistor (CMOSFET) having a very small gate length is obtained through the second related art method as described above. The transistor obtained through this method, in which only a single source•drain ion implantation each is implemented for the nMOS area and the pMOS area, has a "single drain" structure.

While there is no detailed description in the publication, it is necessary to implement a photolithography process to implant ions at the edge of the nMOS body area for channel stopping in the first related art method. FIG. 17 illustrates the relationship between the gate electrode and the body area where the source•drain are formed in a view taken from above the element. The two areas enclosed by the dotted lines in FIG. 17 indicate the edge of the body area where ions need to be implanted for channel stopping.

When implanting ions after a photolithography process, it is necessary to allow for an "alignment margin" between the active area and the resist pattern where channel-stopping ion implantation is to be implemented. FIG. 18 shows the relationship between the active area and the resist pattern provided for channel-stopping ion implantation. As shown in FIG. 18, the width of the resist pattern constitutes the effective gate length. This means that the effective gate length is represented by the value obtained by subtracting the dimension required as the alignment margin from the dimension of the active area width. As miniaturization of elements is pursued with increasing vigor, the alignment margin is bound to become equal to or larger than the effective gate length. Accordingly, the first related art method poses a problem in that when attempting to reduce the element size, the width of the active area cannot be reduced.

FIG. 19 is a sectional view of an element formed at an SOI substrate having a silicon layer formed over an insulating layer. It shows an area (A) where channel stopping is required, an area (B) where channel stopping is not required and an area (C) where channel stopping ions have not been implanted. The area (A) where a high impurity concentrations must be achieved through channel stopping ion implantation is the hatched area in the sectional view presented in FIG. 19 where the film thickness of the silicon layer is reduced ranging over approximately 50 nm from the edge of the body area. In this area, the gate oxide film constituted of the field oxide film has a large thickness. However, since the film thickness of the silicon layer is small, the quantity of the impurity contained in the silicon layer is smaller than the quantity in the area with a larger film thickness. This results in a lowered threshold voltage of the parasitic transistor which manifests hump characteristics shown in FIG. 20. In FIG. 20, the vertical axis represents the drain current (Ids), the horizontal axis represents the gate voltage (Vg), the solid line represents the main transistor characteristics and the dotted line represents the parasitic transistor characteristics. The manifestation of hump characteristics such as those shown in FIG. 20 leads to an increase in the off-leak current (Ioff).

The area (B) in FIG. 19 is an area where it is not necessary to achieve a high impurity concentration. However, when a resist mask is provided through photolithography over an area other than the area where the impurity is injected, the channel stopping impurity is also injected into this area to raise the threshold voltage and, as a result, the area can no longer be included in the effective gate length.

In the second related art method, ions are implanted to form the source•drain from the outside of the sidewall. This allows inconsistency in the film thickness of the sidewall to increase the range over which the gate electrode and the source•drain overlap, which, in turn, leads to an increase in the difference between the physical gate length and the electrical gate length. Or, the film thickness inconsistency may eliminate any overlap of the gate electrode and the source•drain instead and, in such a case, an offset structure is assumed. In either case, there is a problem in that the current value at the transistor fluctuates greatly.

The film thickness of the sidewall is determined by the length over which the impurity is diffused at the source•drain. The impurity diffusion length, in turn, is greatly affected by the temperature at which the heat treatment is performed and also by the impurity concentration. In the second related art method, in which the impurity is injected into the gate electrode concurrently while injecting the impurity into the source•drain, relatively rigorous restrictions must be imposed with regard to the ion implantation conditions and the heat treatment conditions in order to prevent depletion from occurring at the gate electrode.

Namely, (1) the heat treatment must be performed at a high temperature of approximately 1000° C. to fully diffuse and activate the impurity in the gate electrode, and (2) a high concentration equivalent to a dose of $5 \times 10^{15}$ cm$^{-2}$ must be assured since it is necessary to achieve an impurity concentration of $10^{20}$ cm$^{-3}$ or higher in the 20 nm polysilicon.

For the reasons (1) and (2) stated above, it is necessary to allow for a large film thickness of up to 100 nm at the sidewall. However, the absolute value of the film thickness inconsistency becomes larger as the film thickness at the sidewall increases, resulting in a problem of pronounced inconsistency in the transistor characteristics.

In addition, since an nMOS transistor has a different source•drain impurity diffusion constant from that of a pMOS transistor, it is difficult to achieve optimization for both transistors. This is a problem unique to CMOSFETs.

Furthermore, the in-plane inconsistency of the sidewall film thickness is attributed to the film thickness inconsistency resulting from the sidewall etching as well as the inconsistency in the thickness of the oxide film that is formed. Thus, it is difficult to achieve effective control on the sidewall film thickness.

SUMMARY OF THE INVENTION

The present invention has been completed to address the problems of the related art discussed above. A first object of the present invention is to provide a method for manufacturing a field effect transistor achieving a small gate length, which is free from the adverse effect of a parasitic transistor, minimizes the occurrence of a hump and allows an nMOS and a pMOS to be formed next to each other over a small distance.

A second object of the present invention is to provide a method for manufacturing a field effect transistor in which the fluctuation of the current value is minimized by suppressing the short channel effect and eliminating any inconsistency in the film thickness at the sidewall.

In order to achieve the first object, a first field effect transistor manufacturing method according to the present invention, through which a gate electrode, a source•drain are formed on an SOI substrate having a silicon layer formed on an insulating layer, comprises:

a step in which a field oxide film for element isolation is formed;

a step in which an active nitride film is wet-etched until its film thickness is reduced to allow an edge of the silicon layer to be exposed; and a step in which ions of a channel stopping impurity are implanted vertically or at an angle only into the edge of the silicon layer through self-alignment by using the active nitride film as a mask.

In addition, in order to achieve the second object, a second field effect transistor manufacturing method according to the present invention, through which a gate electrode, a source•drain are formed on an SOI substrate having a silicon layer formed on an insulating layer, comprises:

a step in which the gate electrode is etched;

a step in which ions are implanted into the source•drain at an energy level at which all the impurity is injected into the silicon layer constituting the source•drain;

a step in which a heat treatment is implemented at a low temperature under 1000° C. in order to activate the impurity at the source•drain.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
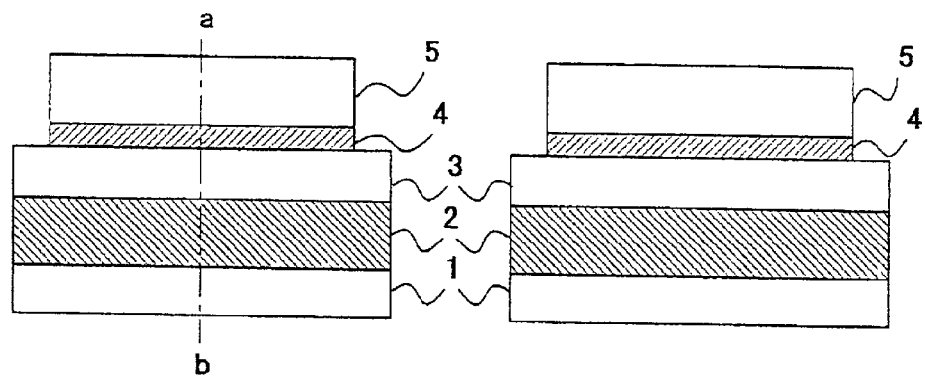
FIGS. 1(A)~1(D) illustrate the method achieved in a first embodiment of the present invention.
Figure 1B:
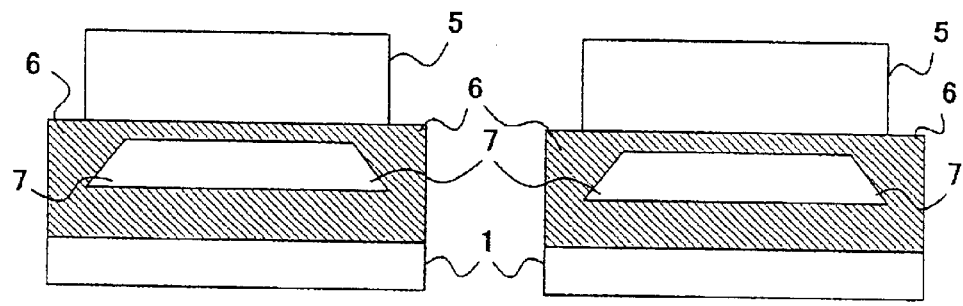
Figure 1C:
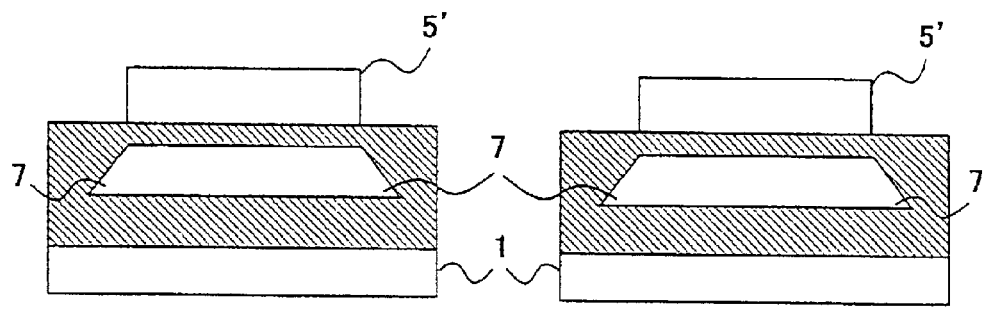
Figure 1D:
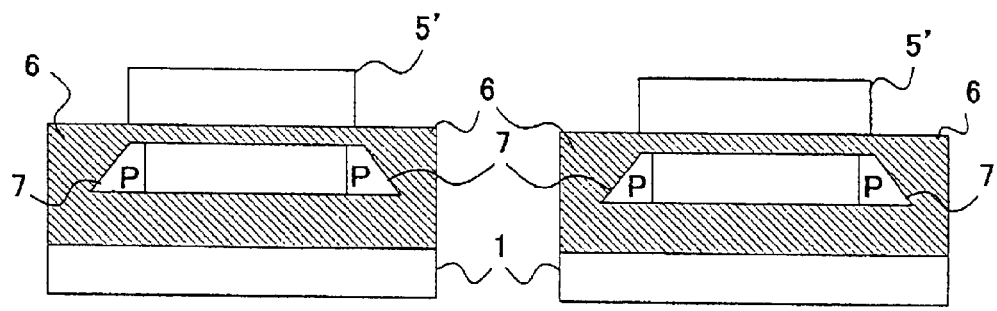

The following is an explanation of the first–seventh embodiments that constitute typical examples of the implementation of the first aspect of the present invention and the eighth–twelfth embodiments that constitute typical examples of the implementation of the second aspect of the present invention, given in reference to the drawings. It is to be noted that the same reference numerals are assigned to components having identical functions and structural features in the specification and the drawings to preclude the necessity for a repeated explanation thereof.

(First Embodiment)

FIGS. 1 and 2 present schematic sectional views provided to facilitate the explanation of the field effect transistor manufacturing method achieved in the first embodiment of the present invention. While the sectional views on the left side are each taken along the direction perpendicular to the gate electrode at the transistor portion, the sectional views on the right side are each taken across the center of the gate electrode along line a–b in the figure on the left side.

In the field effect transistor manufacturing method in the first embodiment which utilizes a SIMOX wafer achieved by forming a buried oxide film (BOX) 2 and a silicon layer 3 over thicknesses of approximately 110 mm and 50 nm respectively on a silicon substrate 1, an oxide film 4 is formed over a thickness of 7 nm through oxidation on the silicon layer 3, a silicon nitride film (SiN) is formed over a thickness of 160 nm through a CVD method on the oxide film 4, a resist pattern (not shown) to be utilized as a mask when patterning an element isolation area is formed, any unnecessary areas of the SiN film and the oxide film 4 are etched by using the resist pattern as a mask and, as a result, an active nitride film 5 is formed (FIG. 1(A)).

Next, the SOI area exposed through etching is oxidized over approximately 100 nm to form an element isolation area 6. The element isolation may be achieved by adopting another isolation method such as STI (shallow trench isolation) and this principle applies to the subsequent embodiments as well. Since oxidation takes place along the horizontal direction as well as the vertical direction during this process, the lower side of edge 7 of the silicon layer 3 is set further inward by approximately 60 nm under the active nitride film 5 relative to the edge of the active nitride film 5 (FIG. 1(B)).

Then, a wet-etching process is implemented by using hydrofluoric acid (HF) in order to remove the oxide film formed at the surface of the silicon nitride film 5a, and the active nitride film 5 is wet-etched over approximately 100 nm with hot phosphoric acid. Since isotropic etching is implemented during the wet-etching process, the film thickness becomes reduced by 100 nm to approximately 60 nm and the edge of the active nitride film 5 recedes by approximately 100 nm as well. Through this etching process, the edge of the silicon layer 3 becomes exposed from under the active nitride film 5' (FIG. 1(C)).

In the next step, after the surface is patterned so as to allow the channel stopping ions to be implanted into the nMOS area alone, $BF_2$ ions are implanted. The ions are implanted through a no-angle vertical ion implantation. While no resist is present at the nMOS area, the presence of the active nitride film 5' at the nMOS area disallows implantation of any impurity into the silicon layer 3 over the area and, thus, the impurity is injected only into the edge 7 of the silicon layer 3. In this manner, the channel stopping ions are implanted through self-alignment, which does not require the alignment margin for photolithography (FIG. 1(D)).

Figure 2E:
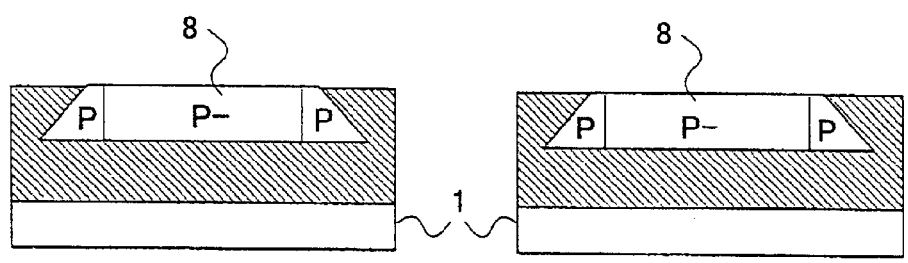
FIGS. 2(E)~2(H) illustrate the method achieved in the first embodiment of the present invention.
Figure 2F:
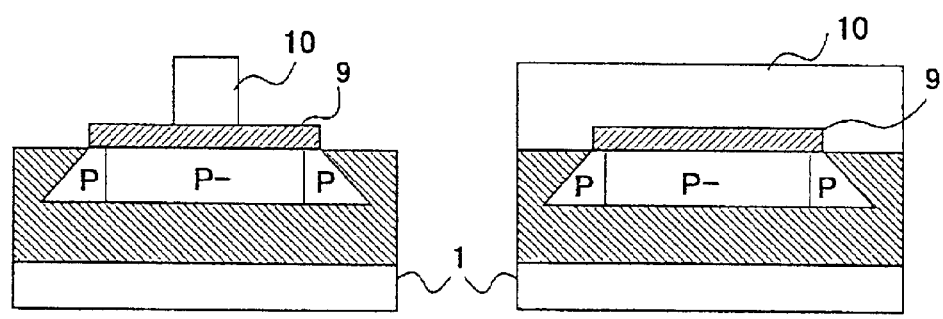
Figure 2G:
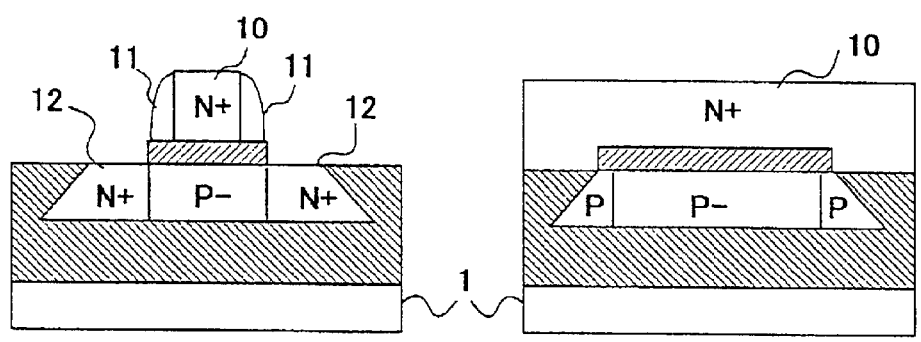
Figure 2H:
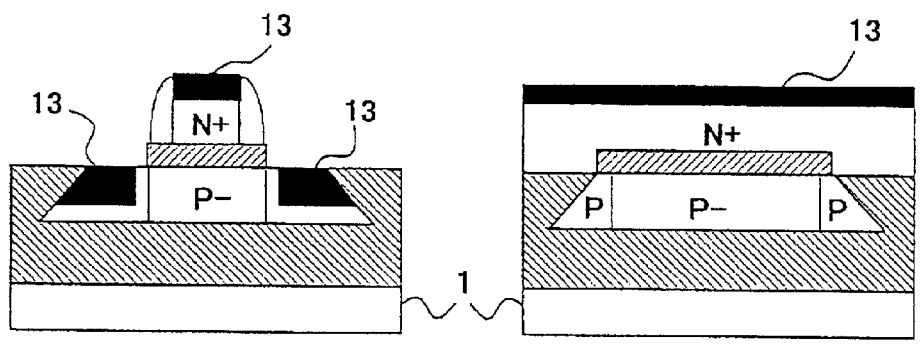

After removing the remaining active nitride film 5', ions of boron fluoride ($BF_2$) are implanted into a body area 8 so as achieve an impurity concentration of approximately $10^{14}$–$10^{19}$ cm$^{-3}$ at the silicon layer 3, in order to control the threshold voltage (FIG. 2(E)).

Next, a gate oxide film 9 is formed over a thickness of 3 nm. A non-doped polysilicon is formed over a thickness of 200 nm on the gate oxide film 9 and a gate electrode 10 having a gate length of approximately 0.15 μm is formed through patterning (FIG. 2(F)).

In the next step, a sidewall 11 constituted of a silicon oxide ($SiO_2$) film is formed and then As is injected through ion implantation to form a source•drain 12. Concurrently, the gate electrode is doped with an impurity to achieve a gate electrode 10 constituted of N$^+$ polysilicon (FIG. 2(G)).

In the following step, an RTA treatment is implemented over several tens of seconds at a temperature set within the range of 900~1100° C., e.g., 1000° C., to activate the impurity. Subsequently, a Co silicide 13 is formed on the source•drain and also on the gate through a Co silicide process, thereby completing the formation of a fully depleted SOI MOSFET (FIG. 2(H)).

(Advantages Achieved in First Embodiment)

As explained above, through the SOI MOSFET manufacturing method in the first embodiment, an SOI MOSFET that is free from the adverse effect of a parasitic transistor and achieves a small gate length is realized by vertically implanting ions of the channel stopping impurity through self-alignment only into the edge of the silicon layer with the active nitride film utilized as a mask after wet-etching the active nitride film until its film thickness is reduced to a small enough value to allow the edge of the silicon layer to become exposed following the field oxidation process.

Figure 3A:
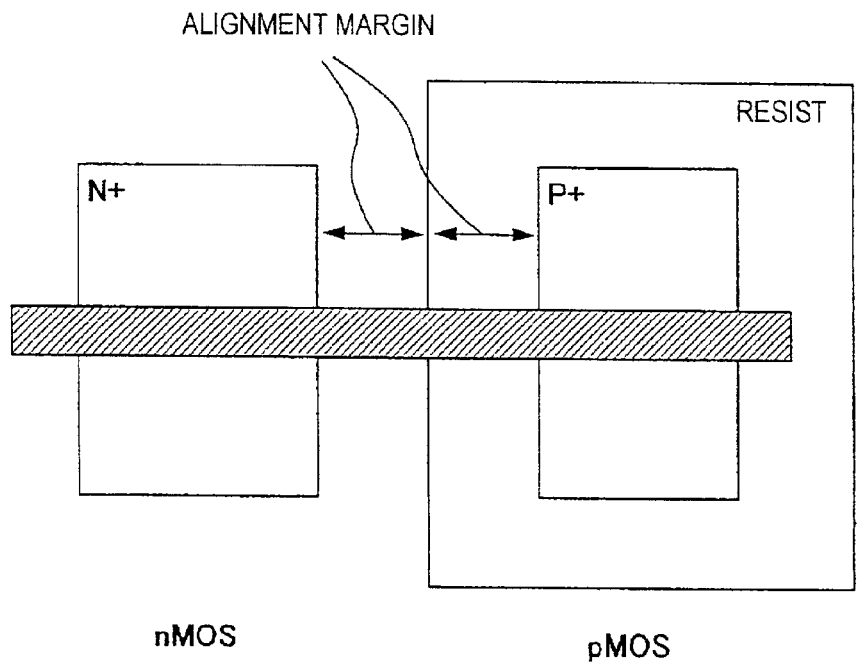
FIG. 3(A) presents a top view and FIG. 3(B) presents a sectional view, both illustrating the relationship achieved between the nMOS transistor and the pMOS transistor when implanting ions.
Figure 3B:
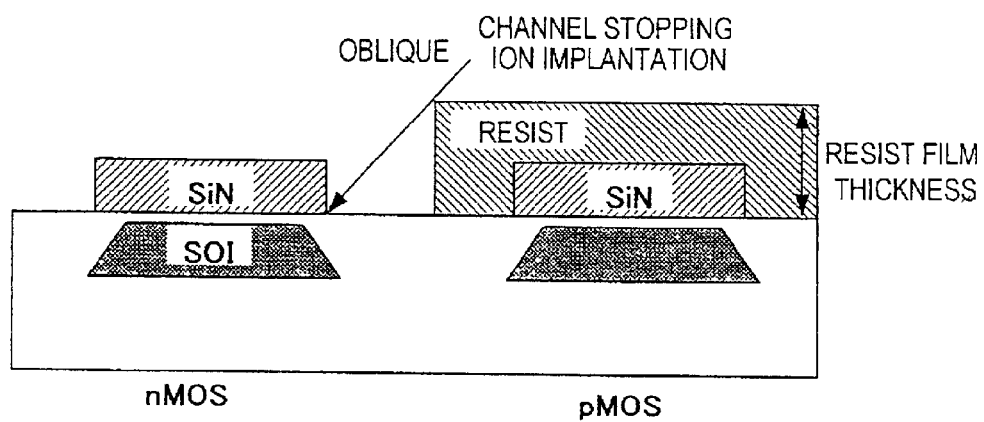

In addition, by implementing a no-angle channel stopping ion implantation, an advantage is achieved in that the distance between an nMOS and an adjacent pMOS can be reduced. FIG. 3(A) and FIG. 3(B) respectively present an upper view and a sectional view illustrating the relationship achieved between the nMOS transistor and the pMOS transistor when implanting ions. When the nMOS transistor and the pMOS transistor are provided next to each other as shown in FIG. 3, the resist utilized when implanting the channel stopping ions is formed at the pMOS area and the distance between the resist and the pMOS/nMOS active areas is determined in conformance to the alignment margin. Since the "resist film thickness" is considerably larger than the "alignment margin" under normal circumstances (resist film thickness>>alignment margin), if the ion implantation is implemented at an angle, the resist film will cast a shadow, which will prevent the ions from being implanted into the edge of the SOI. However, the ions can be implanted at the desired position regardless of the resist film thickness through the vertical ion implantation, to achieve the advantage described above.

(Second Embodiment)

The second embodiment is now explained in reference to FIGS. 1 and 2 used in the explanation of the first embodiment.

In the field effect transistor manufacturing method in the second embodiment which utilizes a SIMOX wafer achieved by forming a buried oxide film 2 and a silicon layer 3 over thicknesses of approximately 110 nm and 50 nm respectively on a silicon substrate 1, an oxide film 4 is formed over a thickness of 7 nm through oxidation on the silicon layer 3, a silicon nitride film is formed over a thickness of 120 nm through a CVD method on the oxide film 4, a resist pattern (not shown) to be utilized as a mask when patterning an element isolation area 6 is formed, any unnecessary areas of the silicon nitride film and the oxide film 4 are etched by using the resist pattern as a mask and, as a result, an active nitride film 5 is formed. The second embodiment differs from the first embodiment in the film thickness of the silicon nitride film which is reduced in the second embodiment. While the silicon layer 3 also becomes etched as the silicon nitride film is etched, the extent to which the silicon layer 3 is ground can be lessened by reducing the SiN film thickness (FIG. 1(A)).

Next, the SOI area exposed through etching is oxidized over approximately 100 nm to form the element isolation area 6. Since oxidation takes place along the horizontal direction as well as the vertical direction during this process, the lower side of edge 7 of the silicon layer 3 is set further inward by approximately 60 nm under the active nitride film 5 relative to the edge of the active nitride film 5 (FIG. 1(B)).

Then, a wet-etching process is implemented by using hydrofluoric acid (HF) in order to remove the oxide film formed at the surface of the silicon nitride film, and the active nitride film 5 is wet-etched over approximately 60 nm with hot phosphoric acid. Since isotropic etching is implemented during the wet-etching process, the film thickness becomes reduced by 60 nm to approximately 60 nm and the edge 7 of the active nitride film 5 recede by approximately 60 nm as well. Through this etching process, the edge 7 of the silicon layer 3 becomes partially exposed from under the active nitride film 5' (FIG. 1(C)).

In the next step, after the surface is patterned so as to allow the channel stopping ions to be implanted into the nMOS area alone, $BF_2$ ions are implanted. The ions are implanted at an angle. The ions may be implanted at, for instance, an angle of 45°. While no resist is present at the nMOS area, the presence of the active nitride film 5' at the nMOS disallows implantation of any impurity into the silicon layer 3 over the area and, thus, the impurity is injected only into the edge 7 of the silicon layer 3. In this manner, the channel stopping ions are implanted through self-alignment, which does not require any alignment margin for photolithography (FIG. 1(D)).

The subsequent steps are implemented as in the first embodiment.

(Advantage Achieved in Second Embodiment)

As explained above, through the SOI MOSFET manufacturing method in the second embodiment, an SOI MOSFET that is free from the adverse effect of a parasitic transistor does not have a large active area width attributable to the need for an alignment margin and achieves a small gate length is realized by implanting ions of the channel stopping impurity obliquely through self-alignment only at the edge of the silicon layer with the active nitride film utilized as a mask after wet-etching the active nitride film until its film thickness is reduced to a small enough value to allow the edge of the silicon layer to become partially exposed following the field oxidation process.

An advantage achieved by injecting ions at an angle is that since the ions are implanted from a diagonal direction, the impurity can be injected even if the edge of the silicon layer is not fully exposed from the active nitride film. As the thickness of the nitride film is reduced, the extent to which the silicon layer becomes ground during the active etching process is lessened to result in a larger film thickness at the field oxide film. Since this field oxide film constitutes the gate oxide film of the parasitic transistor, the threshold voltage of the parasitic transistor at the edge is raised and, as a result, a hump is not readily allowed to manifest.

(Third Embodiment)

FIG. 4 presents schematic sectional views provided to facilitate the explanation of the field effect transistor manufacturing method achieved in the third embodiment of the present invention. While the sectional views on the left side are each taken along the direction perpendicular to the gate electrode at the transistor portion, the sectional views on the right side are each taken across the center of the gate electrode along line a–b in the figure on the left side.

Figure 4A:
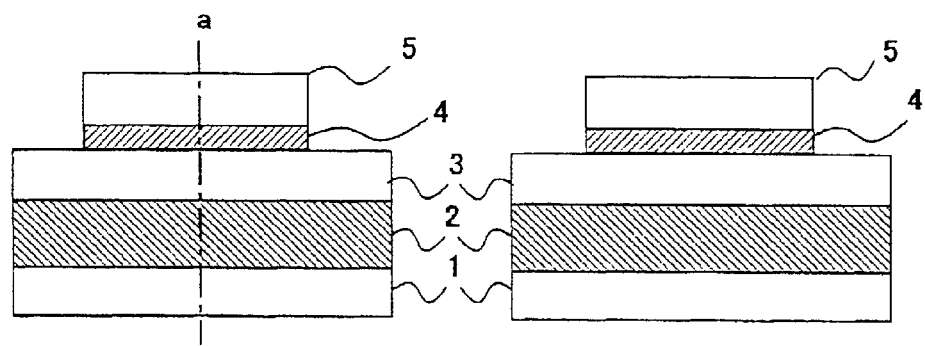
FIGS. 4(A)–4(E) illustrate the method achieved in a third embodiment of the present invention.

In the field effect transistor manufacturing method in the third embodiment which utilizes a SIMOX wafer achieved by forming a buried oxide film 2 and a silicon layer 3 over thicknesses of approximately 110 mm and 50 nm respectively on a silicon substrate 1, an oxide film 4 is formed over a thickness of 7 nm through oxidation on the silicon layer 3, a silicon nitride film is formed over a thickness of 100 nm through a CVD method on the oxide film 4, a resist pattern (not shown) to be utilized as a mask when patterning an element isolation area 6 is formed, any unnecessary areas of the silicon nitride film and the oxide film 4 are etched by using the resist pattern as a mask and, as a result, an active nitride film 5 is formed (FIG. 4(A)).

Figure 4B:
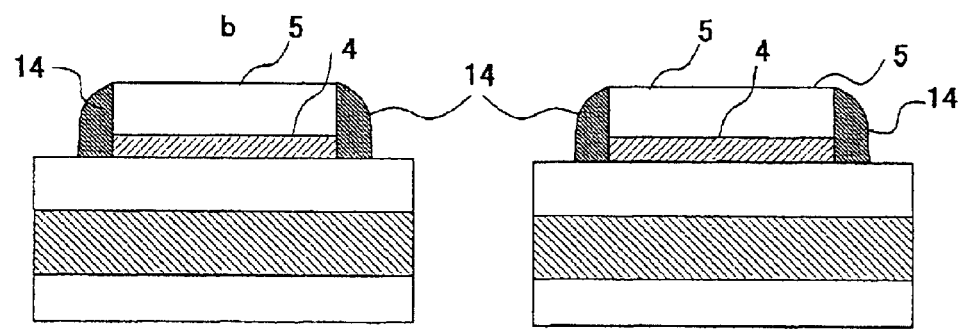
Figure 4C:
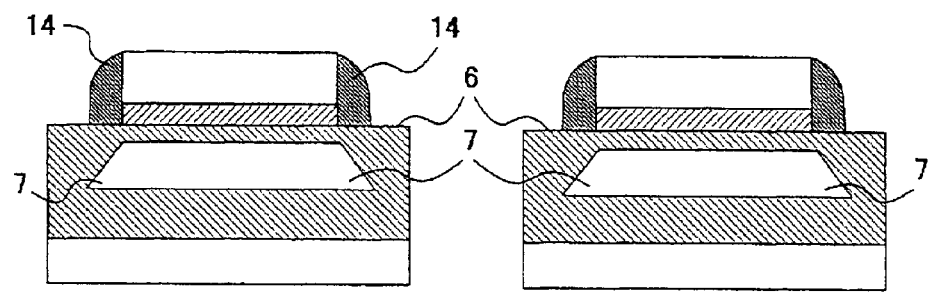
Figure 4D:
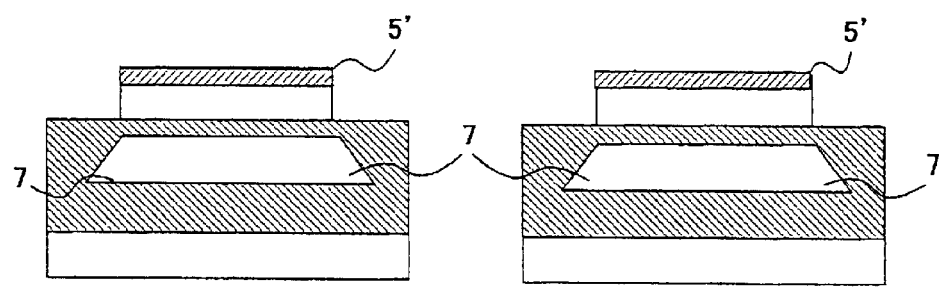
Figure 4E:
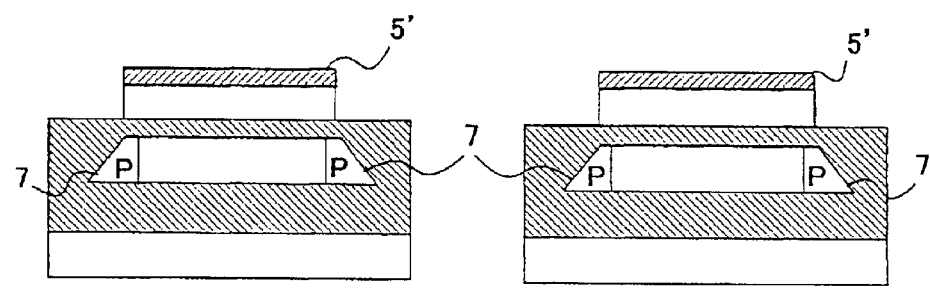

Next, a silicon nitride film is formed over a thickness of approximately 20 mm through a CVD method and then by performing an etch-back over the entire surface, a sidewall 14 constituted of the silicon nitride film is formed at the active nitride film 5 (FIG. 4(B)).

In the following step, the element isolation area 6 is formed by oxidizing the SOI area having become exposed through etching over approximately 100 nm. The presence of the sidewall 14 constituted of silicon nitride film reduces the range of the area over which the oxidation occurs along the horizontal direction compared to the range of oxidation occurring when there is no sidewall 14. The lower sides of the edge 7 of the silicon layer 3 is set at positions that essentially match the position of the edge of the active nitride film 5 (FIG. 4(C)).

Then, a wet-etching process is implemented by using hydrofluoric acid (HF) in order to remove the oxide film formed at the surface of the silicon nitride film, and the active nitride film 5 is wet-etched over approximately 40 nm with hot phosphoric acid. Since isotropic etching is implemented during the wet-etching process, the film thickness becomes reduced by 40 nm to approximately 60 nm and the edge of the active nitride film 5 recedes by approximately 40 nm as well. Through this etching process, the edge of the silicon layer 3 becomes exposed from under the active nitride film 5' (FIG. 4(D)).

In the next step, after the surface is patterned so as to allow the channel stopping ions to be implanted into the nMOS area alone, $BF_2$ ions are implanted. While no resist is present at the nMOS area, the presence of the active nitride film 5' at the nMOS area disallows implantation of any impurity into the silicon layer 3 over the nMOS area and, thus, the impurity is injected only into the edge 7 of the silicon layer 3. In this manner, the channel stopping ions are implanted through self-alignment, which does not require any alignment margin for photolithography (FIG. 4(E)).

The subsequent steps are implemented as in the corresponding steps starting in the FIG. 2(E) illustrating the first embodiment, to complete the formation of a fully depleted CMOSFET.

(Advantages Achieved in Third Embodiment)

As explained above, by adopting the SOI MOSFET manufacturing method in the third embodiment in which a sidewall constituted of a nitride film is formed after dry-etching the active nitride film and then an oxidation process is implemented to achieve element isolation, the film thickness of the active nitride film can be reduced, which, in turn, makes it possible to lessen the extent to which the silicon layer is ground during the active etching process, thereby achieving an advantage in that the occurrence of a hump can be prevented even more effectively than in the first embodiment.

Since the extent to which oxidation occurs along the horizontal direction under the active nitride film can be minimized in the embodiment, the conversion difference between the edge of the active nitride film and the edge of the silicon layer can be reduced compared to the first and second embodiments. For this reason, the thickness of the active nitride film is wet-etched can be reduced to approximately 40 nm, and since it means that the active nitride film can have a smaller initial film thickness, the extent to which the silicon layer becomes ground during the active etching process is reduced. As a result, a large film thickness is achieved for the field oxide film at the SOI edge, which raises the threshold voltage of the parasitic transistor so that a hump does not manifest readily.

In addition, since the thickness of the active nitride film can be reduced without having to implement oblique ion implantation, another advantage is achieved in that the distance between the nMOS and the PMOS provided next to each other can be reduced as in the first embodiment.

(Fourth Embodiment)

The field effect transistor manufacturing method achieved in the fourth embodiment is now explained in reference to FIG. 1 illustrating the first embodiment. After implementing the channel stopping ion implantation in FIG. 1(D), a heat treatment is performed. The heat treatment may be performed within a nitrogen atmosphere or an oxygen atmosphere created inside a furnace at a temperature set within the range of 800~1000° C. over a 10~30 minute period. Alternatively, it may be performed through RTA within a nitrogen or oxygen atmosphere at a temperature set within the range of 900~1100° C. over a period spanning several tens of seconds, e.g., over a 10 second period at 1000° C. Subsequent steps are implemented as are the steps starting in FIG. 2(E) illustrating the first embodiment to complete the formation of a fully depleted CMOSFET.

(Advantages Achieved in Fourth Embodiment)

As explained earlier, by adopting the SOI MOSFET manufacturing method in the fourth embodiment, the wet-etching rate at the field oxide film is lowered by performing a heat treatment after the channel stopping ion implantation and since this allows an increase in the film thickness of the field oxide film present on the silicon layer edge where a parasitic transistor manifests the occurrence of a hump is minimized, thereby achieving an SOI MOSFET which does not have a large active width attributable to the alignment margin.

Figure 5A:
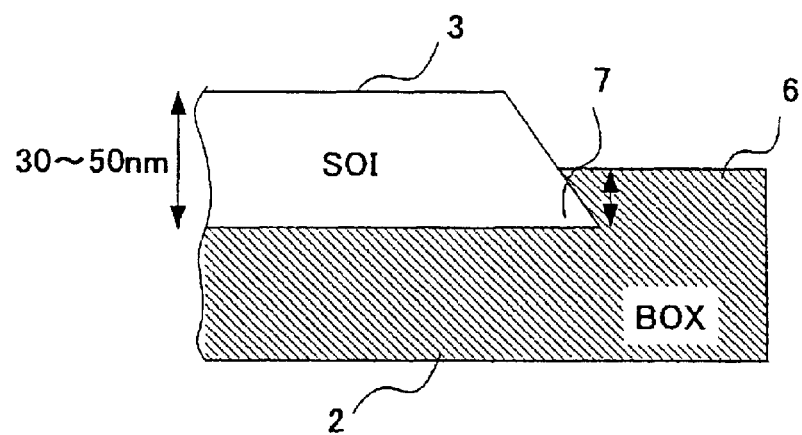
FIGS. 5(A)–5(D) presents sectional views (partial) to allow comparison of the relationships achieved between the element isolation area in the buried oxide film (BOX) and the edge of the silicon layer in the first–fourth embodiments.
Figure 5B:
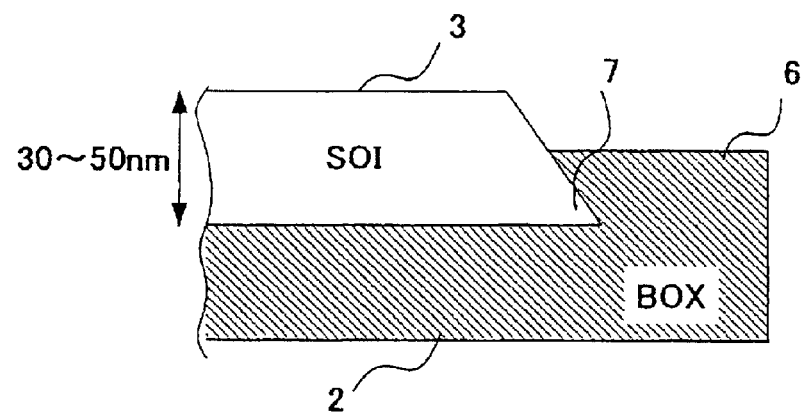
Figure 5C:
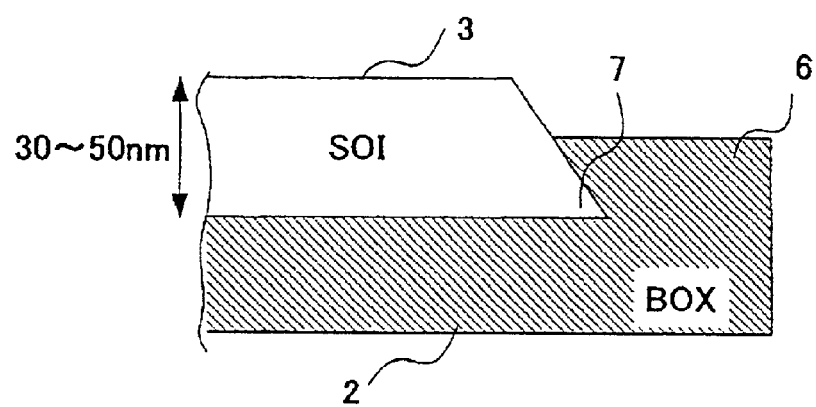
Figure 5D:
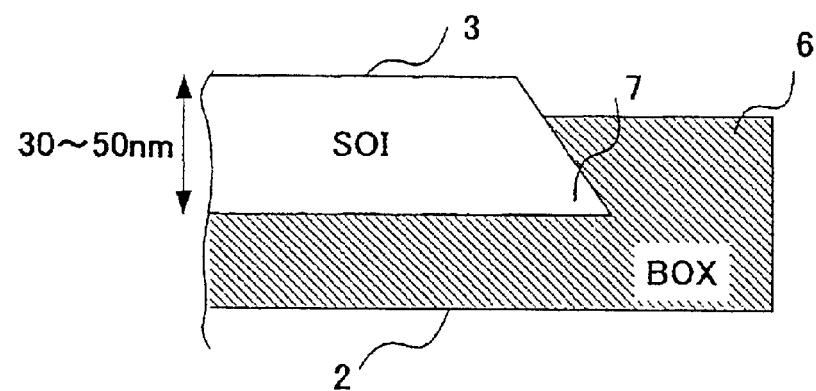

FIG. 5 presents sectional views (partial) provided to allow comparison of the relationships achieved between the element isolation area 6 at the buried oxide film (BOX) 2 and the edge 7 at the silicon layer 3 in the first~fourth embodiments, with FIG. 5(A) presenting a sectional view of the MOSFET achieved in the first embodiment, FIG. 5(B) presenting a sectional view of the MOSFET achieved in the second embodiment, FIG. 5(C) presenting a sectional view of the MOSFET achieved in the third embodiment and FIG. 5(D) presenting a sectional view of the MOSFET achieved in the fourth embodiment. As shown in FIG. 5, the film thickness of the element isolation area 6 increases in the order of first embodiment<second embodiment<third embodiment<fourth embodiment.

(Fifth Embodiment)

FIGS. 6 and 7 present schematic sectional views provided to facilitate the explanation of the field effect transistor manufacturing method achieved in the fifth embodiment of the present invention. While the sectional views on the left side are each taken along the direction perpendicular to the gate electrode at the transistor portion, the sectional views on the right side are each taken across the center of the gate electrode along line a–b in the figure on the left side.

Figure 6A:
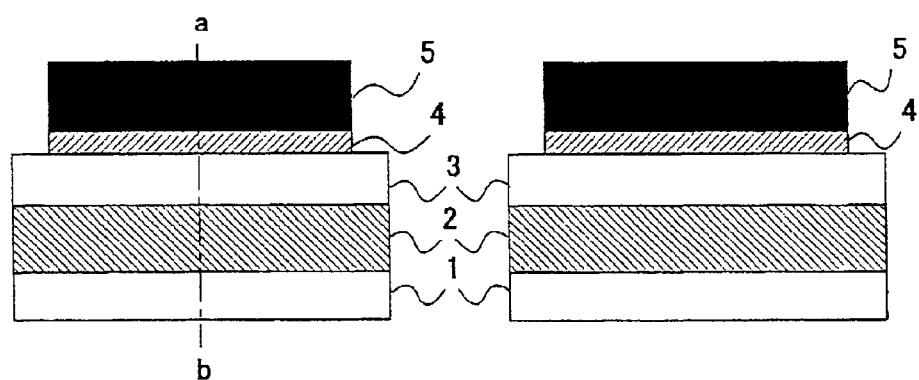
FIGS. 6(A)–6(D) illustrate the method achieved in a fifth embodiment of the present invention.
Figure 6B:
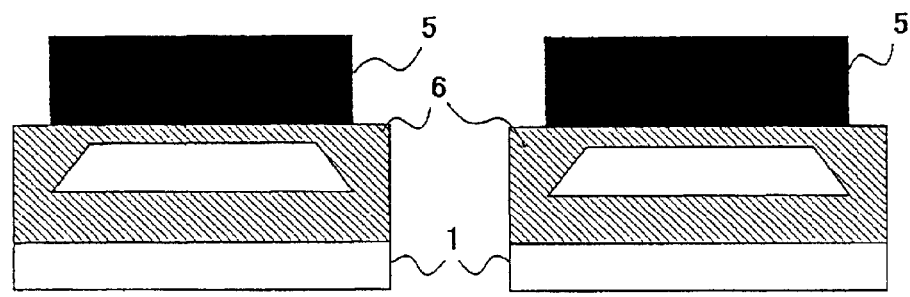
Figure 6C:
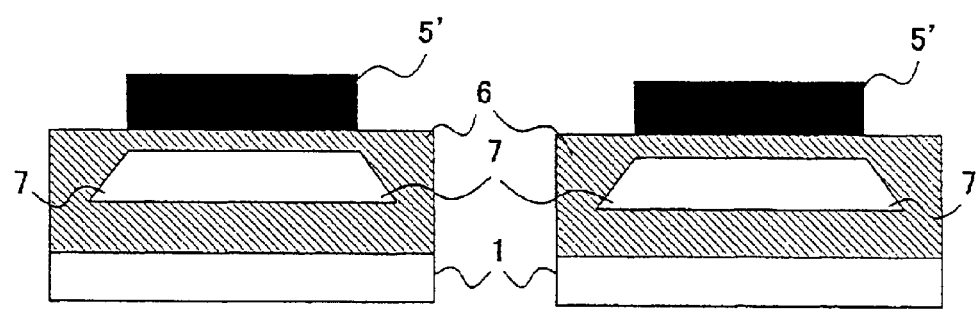
Figure 6D:
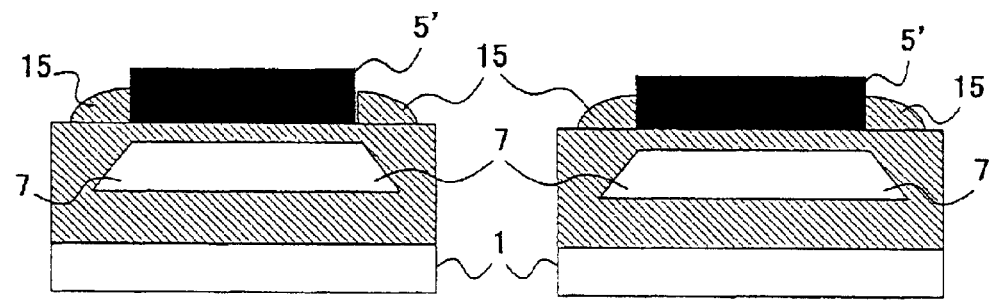

In the field effect transistor manufacturing method in the fifth embodiment which utilizes a SIMOX wafer achieved by forming a buried oxide film 2 and a silicon layer 3 over thicknesses of approximately 100 mm and 50 nm respectively on a silicon substrate 1, an oxide film 4 is formed over a thickness of 7 nm through oxidation on the silicon layer 3, a silicon nitride film 5 is formed over a thickness of 160 nm through a CVD method on the oxide film 4, a resist pattern (not shown) to be utilized as a mask when patterning an element isolation area 6 is formed, any unnecessary areas of the silicon nitride film and the oxide film 4 are etched by using the resist pattern as a mask and, as a result, an active nitride film 5 is formed (FIG. 6(A)).

Next, the SOI area exposed through etching is oxidized over approximately 100 nm to form the element isolation area 6. Since oxidation takes place along the horizontal direction as well as the vertical direction during this process, the upper side of edge 7 of the silicon layer 3 is set further inward by approximately 60 nm under the active nitride film 5 relative to the edge of the active nitride film 5 (FIG. 6(B)).

Then, a wet-etching process is implemented by using hydrofluoric acid (HF) in order to remove the oxide film formed at the surface of the active nitride film 5, and the active nitride film 5 is wet-etched over approximately 60 nm with hot phosphoric acid. Since isotropic etching is implemented during the wet-etching process, the film thickness becomes reduced by 60 nm to approximately 60 nm and the edge of the active nitride film 5 recedes by approximately 60 nm as well. Through this etching process, the edge of the silicon layer 3 becomes partially exposed from under the active nitride film 5' (FIG. 6(C)).

Next, a silicon oxide film 15 is formed over approximately 300 Å (angstroms; the same symbol used hereafter) over the area where the active nitride film 5' is exposed, by performing a heat treatment at a temperature set within the range of 800~900° C. over an appropriate length of time, e.g., by performing heat treatment at 850° C. within an oxygen atmosphere over a period of 30 minutes. During this process, oxygen passes through a pad oxide film to partially oxidize the edge 7 of the silicon layer 3. A thick silicon oxide film 15 is formed on the edge of the silicon layer 3 through this oxidation (FIG. 6(D)).

In the next step, after the surface is patterned so as to allow the channel stopping ions to be implanted into the nMOS area alone, $BF_2$ ions are implanted. The ions are implanted through a no-angle vertical ion implantation. While no resist is present at the nMOS area, the presence of the active nitride film 5' at the nMOS area disallows implantation of any impurity into the silicon layer 3 over the area and, thus, the impurity is injected only into the edge 7 of the silicon layer 3. In this manner, the channel stopping ions are implanted through self-alignment, which does not require any alignment margin for photolithography (FIG. 7(E)).

The ion implantation may be implemented either before or after forming the silicon oxide film 15 at the area where the active nitride film is exposed and similar advantages are achieved either way.

Next, a heat treatment is performed. The heat treatment may be performed within a nitrogen atmosphere or an oxygen atmosphere in a furnace at a temperature set within the range of 800~1000° C. over of 10~30 minute period, or it may be performed through RTA within a nitrogen or oxygen atmosphere at a temperature set within the range of 900~1100° C. over a period spanning several tens of seconds, ideally at 1000° C. over approximately 10 seconds. Such a heat treatment slows down the etching rate at the field oxide film so that the extent to which the field oxide film becomes ground during the subsequent wet-etching process can be lessened.

Then, the remaining active nitride film 5' and the remaining pad oxide film 4 are removed through wet-etching. The presence of the sidewall constituted of the silicon oxide film 15 allows the silicon oxide film to be left on the edge 7 of the silicon layer 3 without reducing its thickness.

Figure 7E:
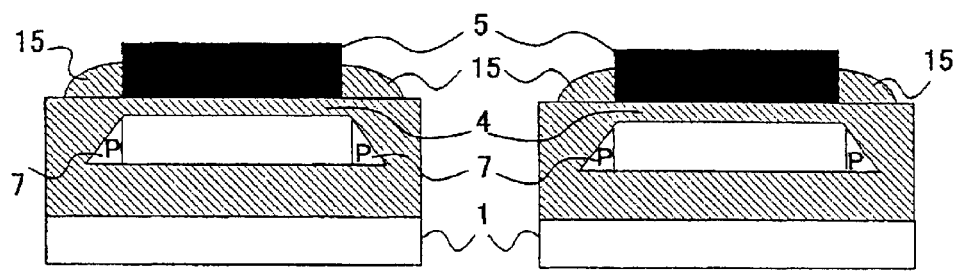
FIGS. 7(E)–7(I) illustrate the method achieved in the fifth embodiment of the present invention.
Figure 7F:
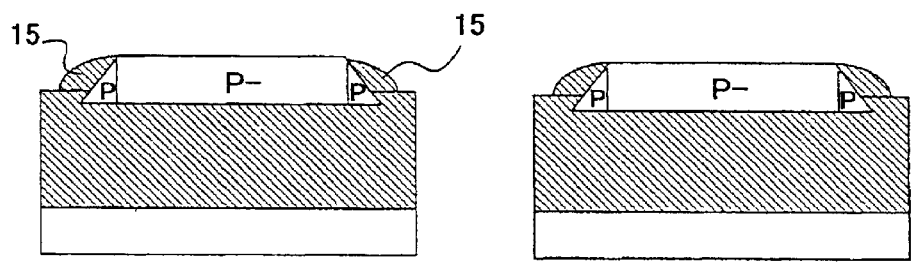
Figure 7G:
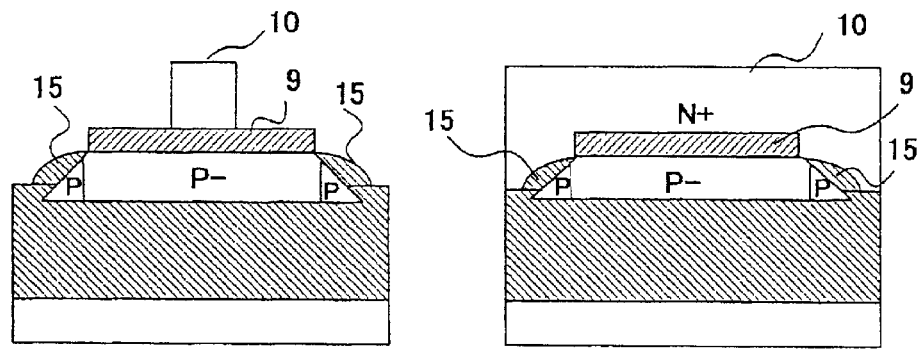
Figure 7H:
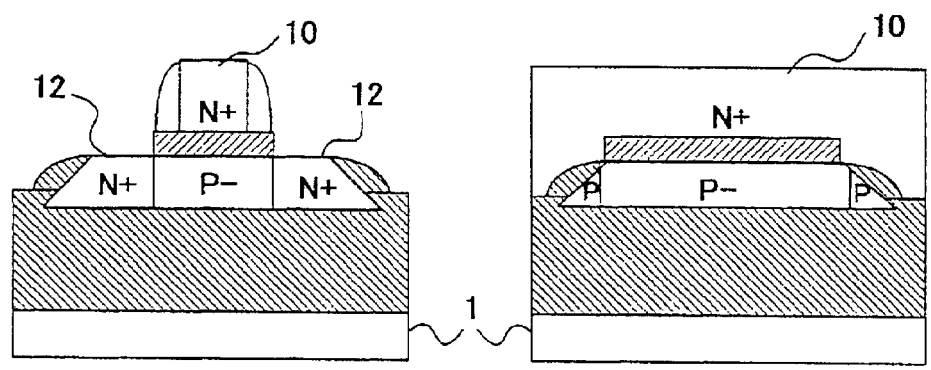
Figure 7I:
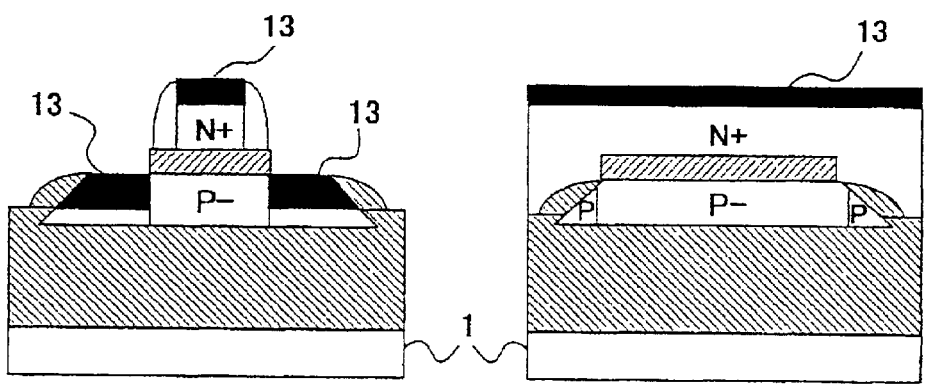

Subsequently, ions of boron fluoride ($BF_2$) are implanted into the body area 8 until an impurity concentration of approximately $10^{14}$~$10^{19}$ cm$^{-3}$ is achieved at the silicon layer 3 to enable control on the threshold voltage (FIG. 7(F)).

Next, a gate oxide film 9 is formed over a thickness of 3 nm. A non-doped polysilicon is formed over a thickness o gate length of approximately 0.15 μm is formed through patterning (FIG. 7(G)).

In the next step, a sidewall 16 constituted of a silicon oxide ($SiO_2$) film is formed and then As is injected through ion implantation to form a source•drain 12. Concurrently, the gate electrode is doped with an impurity to achieve a gate electrode 10 constituted of N$^+$ polysilicon (FIG. 7(H)).

In the following step, an RTA treatment is implemented over several tens of seconds at a temperature set within the range of 900~1100° C., ideally at 1000° C. over a period spanning approximately 10 seconds, to activate the impurity. Subsequently, a Co silicide 13 is formed on the source•drain and also on the gate, thereby completing the formation of a fully depleted SOI MOSFET (FIG. 7(I)).

(Advantage Achieved in Fifth Embodiment)

As explained above, through the SOI MOSFET manufacturing method achieved in the fifth embodiments, an SOI MOSFET having a field oxide film left on the edge of the silicon layer without reducing the thickness of the field oxide film, which is free from the adverse effect of the parasitic transistor and achieves a small gate length, is obtained by forming a silicon oxide film over the area where the edge of the silicon layer is exposed at the sides of the active nitride film after wet-etching the active nitride film to reduce its film thickness to a value small enough to allow the edge of the silicon layer to become exposed following the field oxidation process, by implanting ions of the channel stopping impurity only into the edge of the silicon layer through self-alignment with the active nitride film acting as a mask and by removing the active nitride film and the pad oxide film after a heat treatment.

(Sixth Embodiment)

FIGS. 8 and 9 present schematic sectional views provided to facilitate the explanation of the field effect transistor manufacturing method achieved in the first embodiment of the present invention. While the sectional views on the left side are each taken along the direction perpendicular to the gate electrode at the transistor portion, the sectional views on the right side are each taken across the center of the gate electrode along line a–b in the figure on the left side.

Figure 8A:
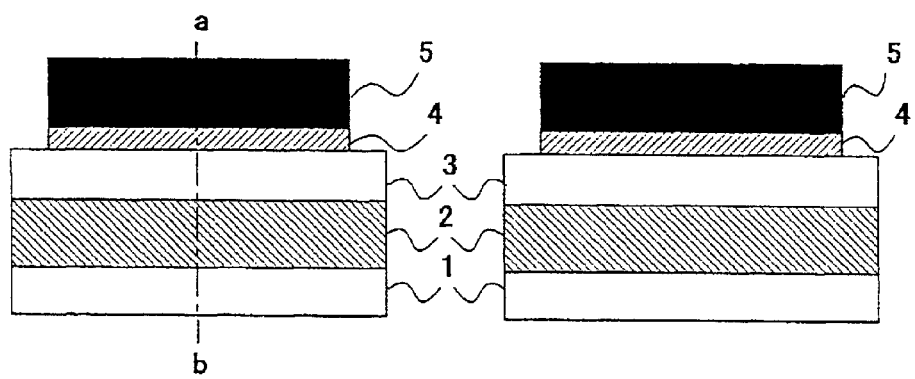
FIGS. 8(A)–8(D) illustrate the method achieved in a sixth embodiment of the present invention.
Figure 8B:
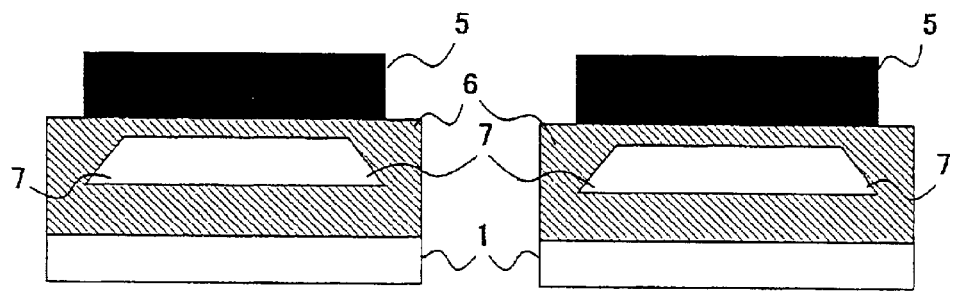
Figure 8C:
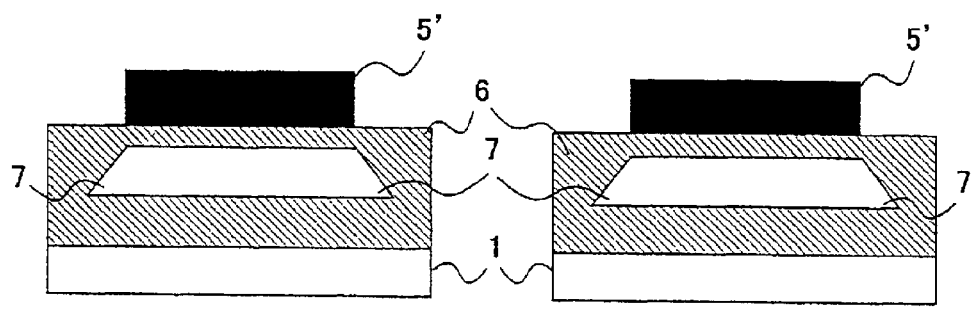
Figure 8D:
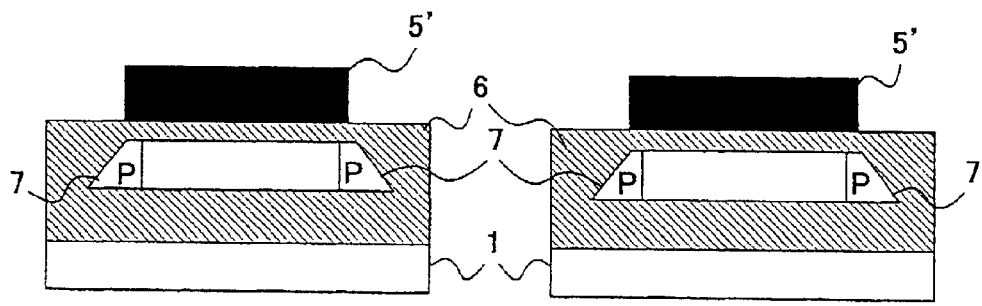
Figure 9E:
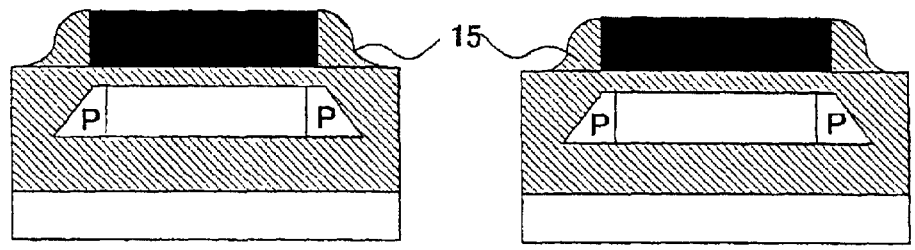
FIGS. 9(E)–9(I) illustrate the method achieved in the sixth embodiment of the present invention.
Figure 9F:
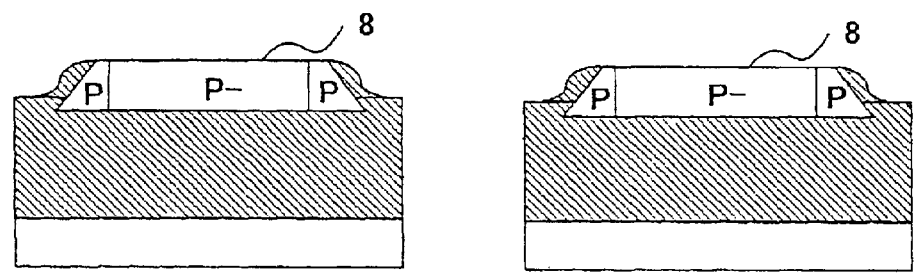
Figure 9G:
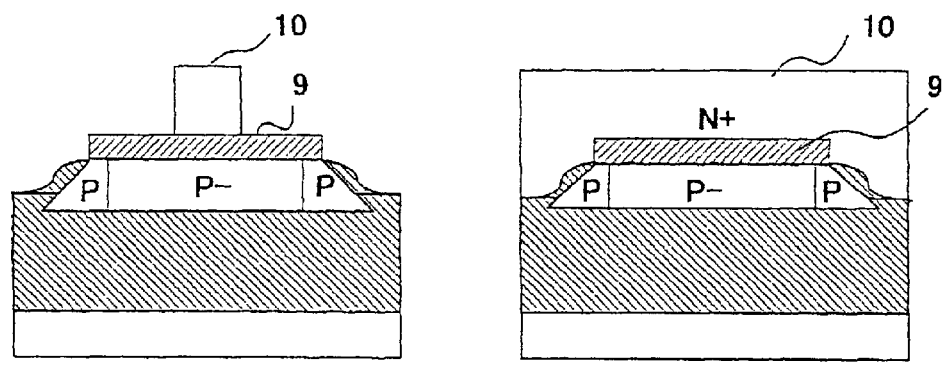
Figure 9H:
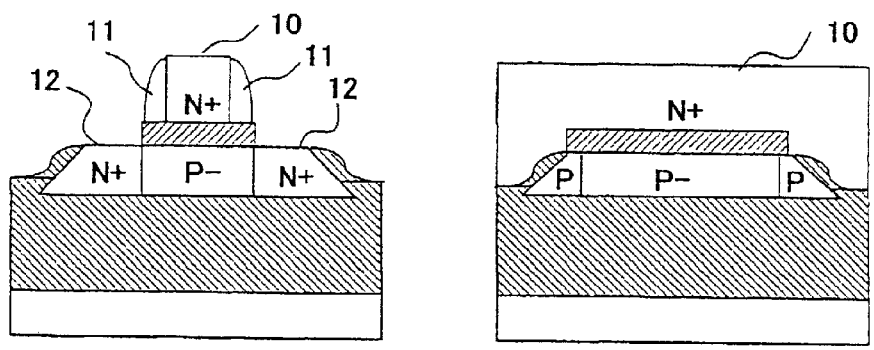
Figure 9I:
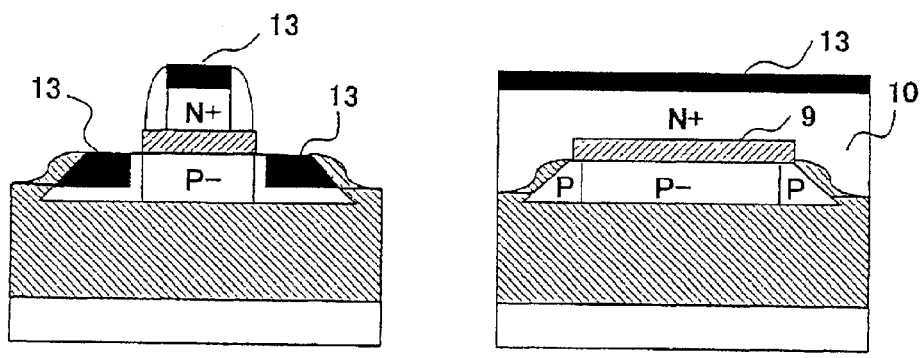

In the field effect transistor manufacturing method in the sixth embodiment which utilizes a SIMOX wafer achieved by forming a buried oxide film 2 and a silicon layer 3 over thicknesses of approximately 100 mm and 50 nm respectively on a silicon substrate 1, an oxide film 4 is formed over a thickness of 7 nm through oxidation on the silicon layer 3, a silicon nitride film is formed over a thickness of 160 nm through a CVD method on the oxide film 4, a resist pattern (not shown) to be utilized as a mask when patterning an element isolation area is formed, any unnecessary areas of the silicon nitride film and the oxide film 4 are etched by using the resist pattern as a mask and, as a result, an active nitride film 5 is formed (FIG. 8(A)).

Next, the SOI area exposed through etching is oxidized over approximately 100 nm to form the element isolation area 6. Since oxidation takes place along the horizontal direction as well as the vertical direction during this process, the upper side of edge 7 of the silicon layer 3 is set further inward by approximately 60 nm under the active nitride film 5 relative to the edge of the active nitride film 5 (FIG. 8(B)).

Then, a wet-etching process is implemented by using hydrofluoric acid (HF) in order to remove the oxide film formed at the surface of the active nitride film 5, and the active nitride film 5 is wet-etched over approximately 100 nm with hot phosphoric acid. Since isotropic etching is implemented during the wet-etching process, the film thickness becomes reduced by 100 nm to approximately 60 nm and the edge of the active nitride film 5 recedes by approximately 60 nm as well. Through this etching process, the edge 7 of the silicon layer 3 becomes exposed from under the active nitride film 5' (FIG. 8(C)).

In the next step, after the surface is patterned so as to allow the channel stopping ions to be implanted into the nMOS area alone, $BF_2$ ions are implanted. The ions are implanted through a no-angle vertical ion implantation. While no resist is present at the nMOS area, the presence of the active nitride film 5' at the nMOS area disallows implantation of any impurity into the silicon layer 3 over the area and, thus, the impurity is injected only into the edge 7 of the silicon layer 3. In this manner, the channel stopping ions are implanted through self-alignment, which does not require any alignment margin for photolithography (FIG. 8(D)).

After the ion implantation, a silicon oxide film is formed over a thickness of 150 nm through the CVD method. Next, the entire surface is etched back through isotropic dry etching to form a sidewall 15 constituted of the silicon oxide film at the active nitride film 5' (FIG. 9(E)).

Next, a heat treatment is performed. The heat treatment may be performed within a nitrogen atmosphere or an oxygen atmosphere in a furnace at a temperature set within the range of 800~1000° C. over a 10~30 minute period, or it may be performed through RTA within a nitrogen or oxygen atmosphere at a temperature set within the range of 900~1100° C. over a period spanning several tens of seconds, ideally at 1000° C. over approximately 10 seconds. Such a heat treatment slows down the etching rate at the field oxide film so that the extent to which the field oxide film becomes ground during the subsequent wet-etching process can be lessened.

Then, the remaining active nitride film 5' and the remaining pad oxide film 4 are removed through wet-etching. The presence of the sidewall 15 constituted of the silicon oxide film allows the silicon oxide film to be left on the edge 7 of the silicon layer 3 without reducing its thickness. Subsequently, ions of boron fluoride ($BF_2$) are implanted into the body area 8 until an impurity concentrations of approximately $10^{14}$~$10^{19}$ cm$^{-3}$ is achieved at the silicon layer 3 to enable control on the threshold voltage (FIG. 9(F)).

Next, a gate oxide film 9 is formed over a thickness of 3 nm. A non-doped polysilicon is formed over a thickness of 200 nm on the gate oxide film 9 and a gate electrode 10 having a gate length of approximately 0.15 μm is formed through patterning (FIG. 9(G)).

In the following step, a sidewall 11 constituted of a silicon oxide film ($SiO_2$) is formed and then As is injected through ion implantation to form a source•drain 12. Concurrently, the gate electrode is doped with an impurity to achieve a gate electrode 10 constituted of N+ polysilicon (FIG. 9(H)).

Then, the impurity is activated through an RTA treatment implemented at 1000° C. Subsequently, a Co silicide 13 is formed on the source•drain 12 and also on the gate electrode 10 through a Co silicide process, thereby completing the formation of a fully depleted SOI MOSFET (FIG. 9(I)).

(Advantages Achieved in Sixth Embodiment)

As explained above, through the SOI MOSFET manufacturing method achieved in the sixth embodiment, an SOI MOSFET which allows the field oxide film to be left on the edge of the silicon layer without becoming thin, is free from the adverse effect of a parasitic transistor and achieves a small gate length is realized by implanting ions of the channel stopping impurity only at the edge of the silicon layer with the active nitride film acting as a mask through self-alignment after wet-etching the active nitride film to reduce its film thickness to a value small enough to allow the edge of the silicon layer to become exposed following the field oxidation process, by performing a heat treatment after forming a sidewall constituted of a silicon oxide film at the sides of the active nitride film and then by removing the active nitride film and the pad oxide film.

(Seventh Embodiment)

Figure 10A:
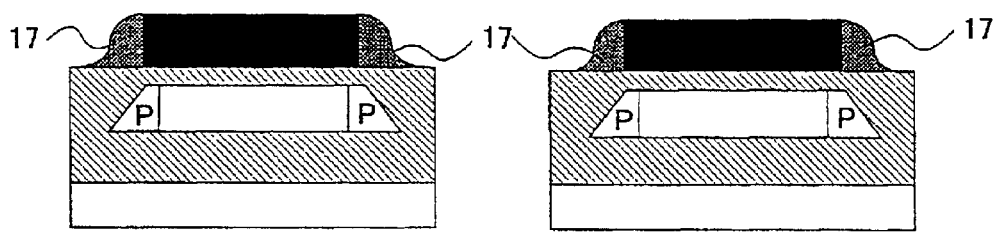
FIGS. 10(A) and 10(B) illustrate the method achieved in a seventh embodiment of the present invention.
Figure 10B:
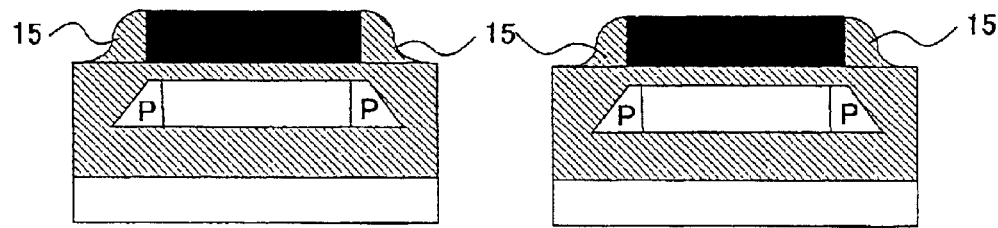

The method achieved in the seventh embodiment of the present invention is now explained in reference to FIG. 8 used in the explanation of the sixth embodiment and FIG. 10. FIG. 10 presents schematic sectional views provided to facilitate the explanation of the field effect transistor manufacturing method achieved in the seventh embodiment of the present invention. While the sectional views on the left side are each taken along the direction perpendicular to the gate electrode at the transistor portion, the sectional views on the right side are each taken across the center of the gate electrode along line a–b in the figure on the left side.

In the field effect transistor manufacturing method in the seventh embodiment which utilizes a SIMOX wafer achieved by forming a buried oxide film 2 and a silicon layer 3 over thicknesses of approximately 110 mm and 50 nm respectively on a silicon substrate 1, an oxide film 4 is formed over a thickness of 7 nm through oxidation on the silicon layer 3, a silicon nitride film 5a is formed over a thickness of 160 nm through a CVD method on the oxide film 4, a resist pattern (not shown) to be utilized as a mask when patterning an element isolation area 6 is formed, any unnecessary areas of the silicon nitride film 5a and the oxide film 4 are etched by using the resist pattern as a mask and, as a result, an active nitride film 5 is formed (FIG. 8(A)).

Next, the SOI area exposed through etching is oxidized over approximately 100 nm to form the element isolation area 6. Since oxidation takes place along the horizontal direction as well as the vertical direction during this process, the upper side of edge 7 of the silicon layer 3 is set further inward by approximately 60 nm under the active nitride film 5 relative to the edge of the active nitride film (FIG. 8(B)).

Then, a wet-etching process is implemented by using hydrofluoric acid (HF) in order to remove the oxide film formed at the surface of the active nitride film 5, and the active nitride film 5 is wet-etched over approximately 60 nm with hot phosphoric acid. Since isotropic etching is implemented during the wet-etching process, the film thickness becomes reduced by 60 nm to approximately 60 nm and the edge of the active nitride film 5 recedes by approximately 60 nm as well. Through this etching process, the edge of the silicon layer 3 becomes partially exposed from under the active nitride film 5' (FIG. 8(C)).

In the next step, after the surface is patterned so as to allow the channel stopping ions to be implanted into the nMOS area alone, $BF_2$ ions are implanted. The ions are implanted through a no-angle vertical ion implantation. While no resist is present at the nMOS area, the presence of the active nitride film 5' at the nMOS area disallows implantation of any impurity into the silicon layer 3 over the nMOS area and, thus, the impurity is injected only into the edge 7 of the silicon layer 3. In this manner, the channel stopping ions are implanted through self-alignment, which does not require any alignment margin for photolithography (FIG. 8(D)).

After the ion implantation, a polysilicon film is formed over a thickness of 75 nm through a CVD method. Next, the entire surface is etched back through isotropic dry-etching to form a sidewall 17 constituted of the polysilicon at the active nitride film 5' (FIG. 10(A)).

Since the sidewall 17 is formed by using the polysilicon, a large etching selection ratio is achieved for the polysilicon and the field oxide film, making it possible to prevent the field oxide film from becoming ground during the full-surface etch-back process.

Next, the sidewall 17 constituted of the polysilicon is oxidized by performing a heat treatment within an oxygen atmosphere at a temperature set within the range of 800~1000° C. over a 10~30 minute period, e.g., at 950° C. over a 30 minute period and, as a result, a sidewall 15 constituted of the silicon oxide film is formed. During the process, the oxidizing heat treatment is performed until the polysilicon becomes completely oxidized. Through this oxidizing heat treatment, the sidewall 17 constituted of the polysilicon is transformed into the sidewall 15 constituted of the silicon oxide film having a thickness double that of the sidewall 17. In addition, during the oxidizing heat treatment, the field oxide film also undergoes a heat treatment and this slows down the etching rate of the field oxide film, thereby making it possible to reduce the extent to which the field oxide film becomes ground during the subsequent wet-etching process (FIG. 10(B)).

However, if the oxidizing heat treatment is performed for an overly extended period of time, the silicon layer beyond the oxide film also becomes oxidized to result in a reduced thickness of the silicon layer and, in such a case, the transistor characteristics will become poorer. Accordingly, it is necessary to ensure that the oxidizing heat treatment is performed only until the sidewall 17 constituted of the polysilicon becomes fully oxidized. The subsequent steps are performed as in the fifth embodiment.

(Advantages Achieved in Seventh Embodiment)

As explained above, through the SOI MOSFET manufacturing method achieved in the seventh embodiment, an SOI MOSFET which allows the field oxide film to be left on the edge of the silicon layer without becoming thin, is free from the adverse effect of the parasitic transistor and achieves a small gate length is realized by implanting ions of the channel stopping impurity only at the edge of the silicon layer with the active nitride film acting as a mask through self-alignment after wet-etching the active nitride film to reduce its film thickness to a value small enough to allow the edge of the silicon layer to become exposed following the field oxidation process, by oxidizing the sidewall constituted of the polysilicon film formed at the sides of the active nitride film and then by removing the active nitride film and the pad oxide film.

The advantages achieved by forming the sidewall constituted of the polysilicon film at the active nitride film include a greater etching selection ratio which will prevent the field oxide film from becoming ground after the polysilicon is removed through the full-surface etchback process during the formation of the sidewall and simplification of the manufacturing process achieved by simultaneously performing a heat treatment on the field oxide film while oxidizing the polysilicon.

Figure 11E:
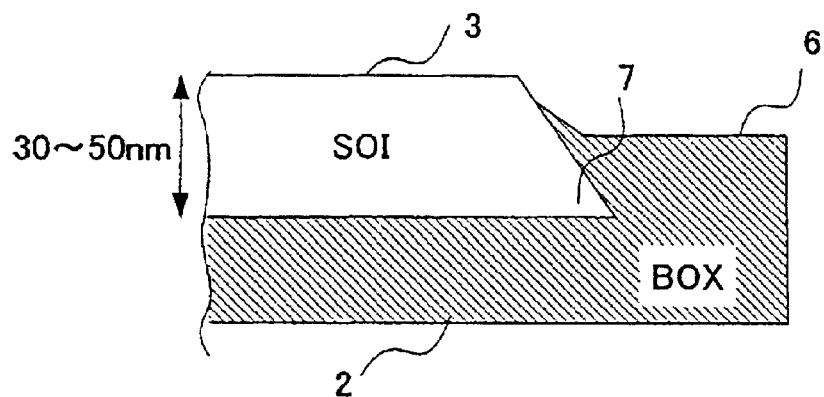
FIG. 11(E)–11(G) presents sectional views (partial) to allow comparison of the relationships achieved between the element isolation area in the buried oxide film (BOX) and the edge of the silicon layer in the fifth seventh embodiments.
Figure 11F:
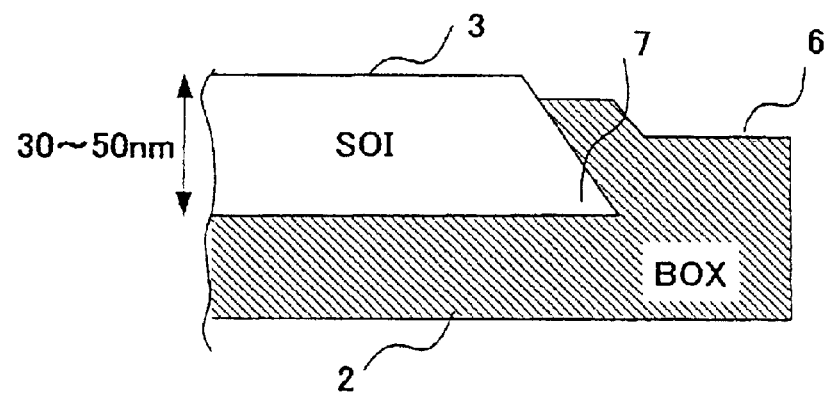
Figure 11G:
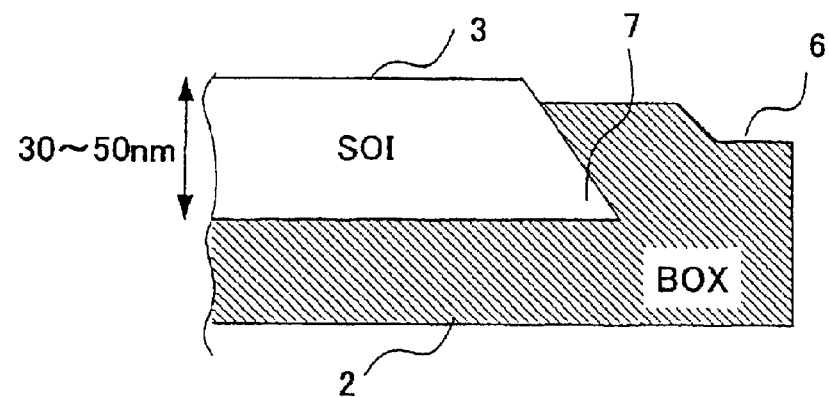

FIG. 11 presents sectional views (partial) provided to allow comparison of the relationships achieved between the element isolation area 6 at the buried oxide film (BOX) 2 and the edge 7 of the silicon layer 3 in the fifth~seventh embodiments, with FIG. 11(E) presenting a sectional view of the MOSFET achieved in the fifth embodiment, FIG. 11(F) presenting a sectional view of the MOSFET achieved in the sixth embodiment and FIG. 11(G) presenting a sectional view of the MOSFET achieved in the seventh embodiment. As shown in FIG. 11, the element isolation area 6 becomes raised over the area close to the silicon layer 3 to a larger extent than in the fourth embodiment shown in FIG. 5(D). The extent to which the element isolation area 6 is raised increases in the order of; fifth embodiment<sixth embodiment<seventh embodiment.

(Eighth Embodiment)

Figure 12A:
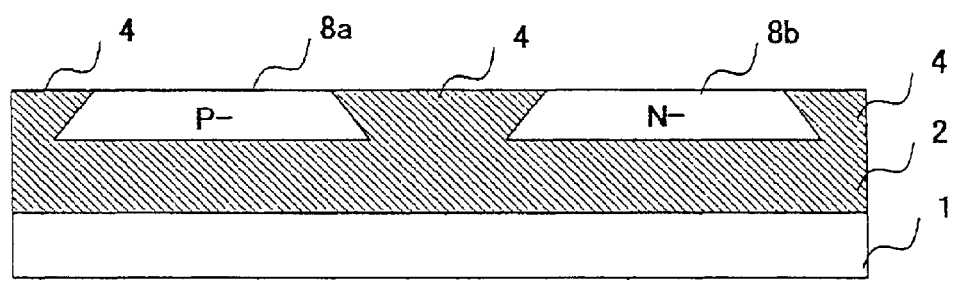
FIGS. 12(A)–12(D) illustrate the method achieved in an eighth embodiment of the present invention.
Figure 12B:
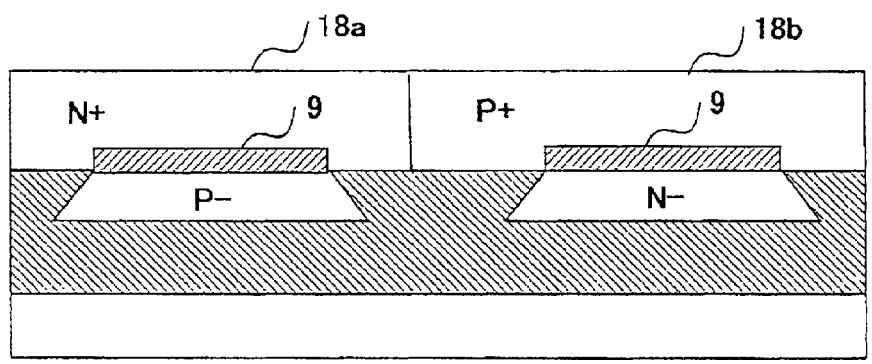

FIGS. 12 and 13 present schematic sectional views provided to facilitate the explanation of the field effect transistor manufacturing method achieved in the eighth embodiment of the present invention. While the sectional views on the left side are each taken along the direction perpendicular to the gate electrode at the transistor portion, the sectional views on the right side are each taken across the center of the gate electrode along line a–b in the figure on the left side.

In the field effect transistor manufacturing method achieved in the eighth embodiment, a field oxide film 4 is formed for element isolation on an SOI substrate having a buried oxide film 2 and a silicon layer 3 formed on a silicon substrate 1. Next, ions of boron fluoride ($BF_2$) and phosphorus (P) are implanted into body areas 8(A) and 8(D) to constitute an nMOS and a pMOS until an impurity concentration of approximately $10^{14}$~$10^{18}$ cm$^{-3}$ is achieved at the silicon layer 3 (FIG. 12(A)).

Next, a gate oxide film 9 is formed over a thickness of 3 nm in an oxidizing furnace. Then, polysilicon films 18a and 18b are formed over a thickness of 200 nm over the gate oxide films 9 through an LPCVD method. Then, ions of phosphorus (P) and boron (B) are implanted into the area to constitute an nMOS and a pMOS so as to achieve an impurity concentration of approximately $10^{20}$~$10^{21}$ cm$^{-3}$ at the polysilicon films 18a and 18b. The impurity seeds used for this purpose are not limited to these particular impurity seeds. In the next step, a heat treatment is performed at a temperature set at approximately 1000° C. to activate the impurities in the polysilicon to constitute gate electrodes (FIG. 12(B)).

Figure 12C:
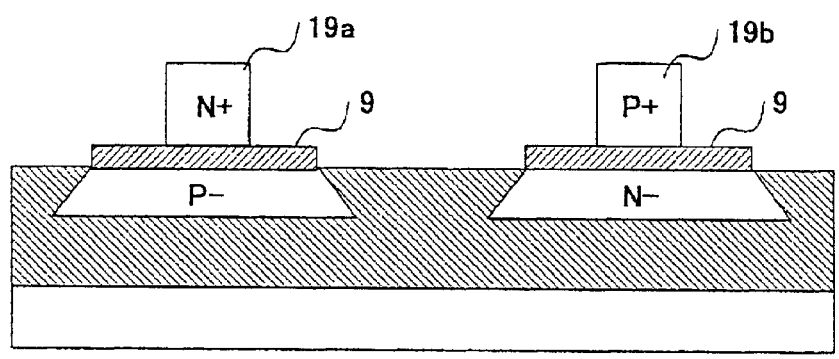
Figure 12D:
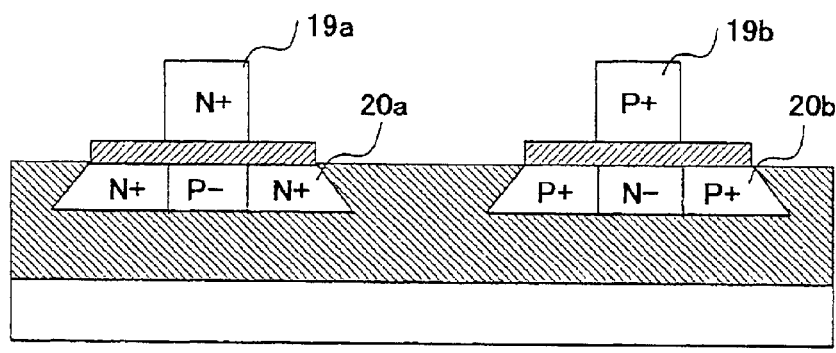
Figure 13E:
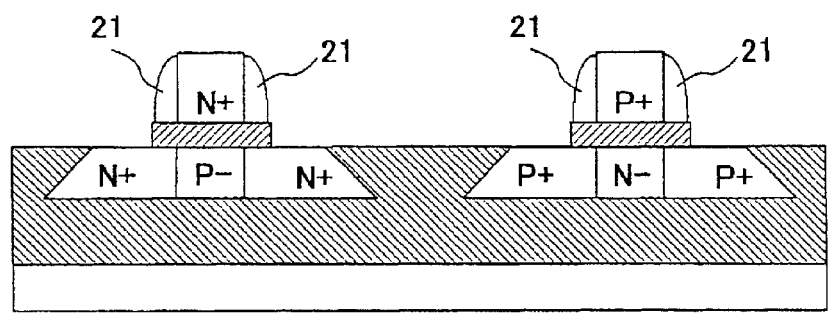
FIGS. 13(E) and 13(F) illustrate the method achieved in the eighth embodiment of the present invention.

Then, a resist pattern (not shown) to be used as a mask for patterning the gate electrodes is formed, and by etching the unnecessary portions of the polysilicon films 18a and 18b with the resist pattern acting as a mask, polysilicon gate electrodes 19a and 19b having a gate length of approximately 0.1 m are formed (FIG. 12(C)).

Next, As and $BF_2$ are injected into the nMOS area and the pMOS area through ion implantation and, as a result, an nMOSFET S/D 20a and a pMOSFET S/D 20b are formed. The level of the energy used in this process should be set so as to allow all the impurities to be introduced into the thin silicon layer 3 where the sources and the drains are formed (FIG. 12(D)).

In the following step, an $SiO_2$ film, an SiN film or a compound film achieved by combining an $SiO_2$ film and an SiN film is formed over a thickness of 50 nm through a CVD method and then an etch-back is performed through reactive ion etching (RIE) to form sidewalls 21. A heat treatment is performed at a relatively low temperature of, for instance, 950° C. over a 10 second period through RTA (FIG. 13(E)).

Figure 13F:
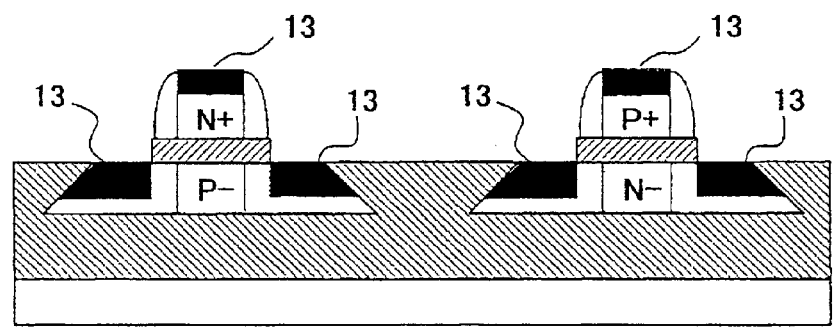

Then, a Co silicide process is performed to form a Co silicide 13 on the sources•drains 12 and the gate electrodes 19a and 19b, thereby completing the formation of a fully depleted SOI CMOSFET (FIG. 13(F)).

(Advantages Achieved in Eighth Embodiment)

As explained above, through the SOI MOSFET manufacturing method achieved in the eighth embodiment, a MOSFET which does not manifest fluctuations in the characteristics due to inconsistency in the sidewall film thickness and achieves a small channel length while suppressing the adverse short channel affect is realized by injecting the impurities into the gate electrodes and activating the impurities prior to the ion implantation at the sources•drains to allow the activating heat treatment to be performed at a lower temperature after the source drain ion implantation and by implementing the source•drain ion implantation immediately after etching the gate electrodes.

When ions are implanted simultaneously into the sources•drains and the gate electrodes, the energy level is set so as to implant all the impurities into the sources•drains at the SOI with a small thickness of 500 Å or less, and thus, the concentration tends to be high only at the surface of the polysilicon constituting the gates. Accordingly, the heat treatment needs to be performed at a high temperature of 1000° C. or higher in order to increase the impurity concentration in the areas near the interfaces with the gate oxide films. Since the impurities at the sources•drains whose thickness is 500 Å or less alone need to be activated in the eighth embodiment, the temperature can be lowered by approximately 50° C. during the heat treatment to lower the extent of horizontal diffusion. As a result, the adverse short channel effect can be suppressed even though ions are implanted into the sources•drains immediately after etching the gate electrodes and an SOI MOSFET achieving a short channel length is obtained.

Such a single drain structure can be achieved by performing an ion implantation after the formation of the gate electrodes as described above largely because of the small thickness of the silicon layer on which the MOSFET is formed. Since the BOX film is present under the silicon layer, the depth of the S/D does not exceed the silicon layer thickness. For this reason, the depthwise-direction profile is not an element of concern under the conditions in which the ions are implanted into the sources•drains, and it is necessary to take into consideration the horizontal source•drain profile control alone in order to lessen the extent of the adverse short channel effect. In addition, since there is no junction present under the sources•drains when a Co silicide is formed on the SOI, it is not necessary to take into consideration the possibility of occurrence of junction leak under the sources•drains either. In contrast, a standard bulk MOSFET poses a problem in that the short channel affect cannot be lessened simply by forming shallow sources•drains since there is a risk of a junction leakage occurring in under the sources•drains if the sources•drains are shallow.

(Ninth Embodiment)

Now, the field effect transistor manufacturing method achieved in the ninth embodiment of the present invention is explained in reference to FIG. 12 illustrating the eighth embodiment.

Since the steps shown in FIGS. 12(A) through 12(C) are implemented as in the eighth embodiment, their explanation is omitted. Following these steps, ions of As and $BF_2$ are implanted into an nMOS area and a pMOS area and thus, an nMOSFET S/D 20a and a pMOSFET S/D 20b are formed. The dose should be set so as to achieve an impurity concentration of at least $10_{20}$ cm$^{-3}$ in the silicon layer constituting S/Ds. The silicon layer in a fully depleted device has a small layer thickness of approximately 500 Å or less which is only ¼ of the thickness (2000 Å) of the polysilicon film constituting the gate electrodes and, as a result, an impurity concentration of $10^{20}$ cm$^{-3}$ or higher can be achieved at the gate electrodes by reducing the dose for the As and $BF_2$ ion implantation to approximately ¼ of the dose required when implanting ions concurrently during the ion implantation at the gate electrodes (FIG. 12(D)). The subsequent steps are implemented as in the eighth embodiment.

(Advantages Achieved in Ninth Embodiment)

As described above, through the SOI MOSFET manufacturing method achieved in the ninth embodiment, an SOI MOSFET which does not manifest fluctuations in the characteristics attributable to inconsistency in the sidewall film thickness and achieves a small channel length while even more effectively suppressing the adverse short channel effects than the eighth embodiment is realized by implanting the impurities into the gate electrodes and activating the impurities prior to the source•drain ion implantation process and by reducing the dose for the source•drain ion implantation to approximately ¼ of the dose required when performing the source•drain ion implantation simultaneously during the gate electrode ion implantation.

While it is necessary to set the dose so as to achieve an impurity concentration of at least $10^{20}$ cm$^{-3}$ in the polysilicon having a thickness of 2000 Å in order to prevent depletion at the gates when ions are simultaneously implanted into the sources•drains and the gate electrodes, only ¼ of the dose is required to achieve an impurity concentration of $10^{20}$ cm$^{-3}$ within the sources•drains having a small thickness of 500 Å or less. As a result, the impurity concentration at the sources•drains is reduced to suppress the extent of the horizontal diffusion, which, in turn, further suppresses the extent of the adverse short channel effect compared to the extent of the short channel effect manifesting when the impurity concentration at the sources•drains is high, thereby making it possible to realize an SOI MOSFET with an even smaller channel length.

The impurity concentration of $10^{20}$ cm$^{-3}$ at the sources•drains represents the lowest possible concentration at which the contact resistance of the Co silicide and Si does not increase. Since the short channel effect can be further suppressed as the concentration becomes lower, the extent to which the short channel effect is lessened is maximized by measuring the contact resistance of the Co silicide and the Si and lowering the concentration as much as possible within the range over which the resistance does not increase.

(Tenth Embodiment)

FIG. 14 presents schematic sectional views provided to facilitate the explanation of the field effect transistor manufacturing method achieved in the tenth embodiment of the present invention. While the sectional views on the left side are each taken along the direction perpendicular to the gate electrode at the transistor portion, the sectional views on the right side are each taken across the center of the gate electrode along line a–b in the figure on the left side. Since steps in the tenth embodiment corresponding to FIGS. 12(A) through 12(C) are implemented as in the eighth embodiment, their explanation is omitted.

In the following step, ions of As are implanted into the nMOS area at a low energy level which allows the formation of a pn junction in the silicon layer to form a shallow S/D 22d achieving an impurity concentration of $10^{20}$ cm$^{-3}$ or higher at the surface of the silicon layer constituting the source•drain. Also, ions of As are implanted at an energy level which will allow the impurity to be evenly injected over the entire silicon layer to form a deep S/D 23a achieving an impurity concentration toward the rear surface of the silicon layer constituting the source•drain within the range equal to or higher than the channel impurity concentration and equal to or lower than $10^{19}$ cm$^{-3}$. The dose set for the ion implantation implemented to form the deep source drain is approximately ¹/₁₀ or less of the dose set for the ion implantation implemented to form the shallow source•drain (FIG. 14(D)).

Figure 14D:
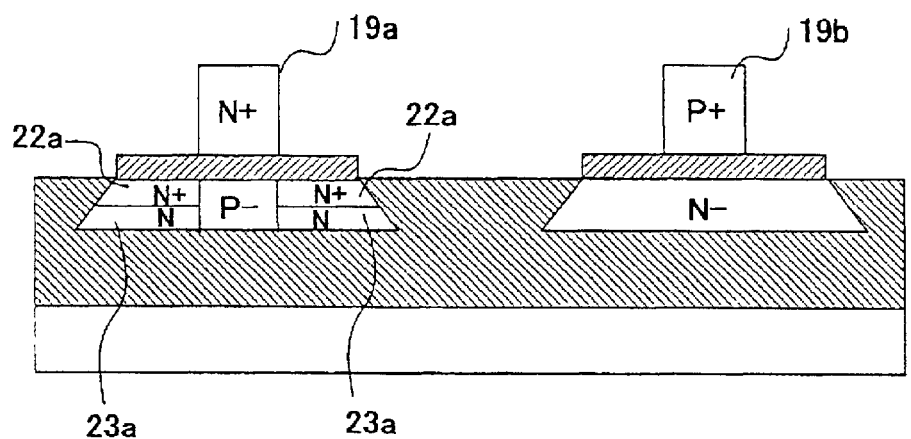
FIGS. 14(D)–14(G) illustrate the method achieved in a tenth embodiment of the present invention.
Figure 14E:
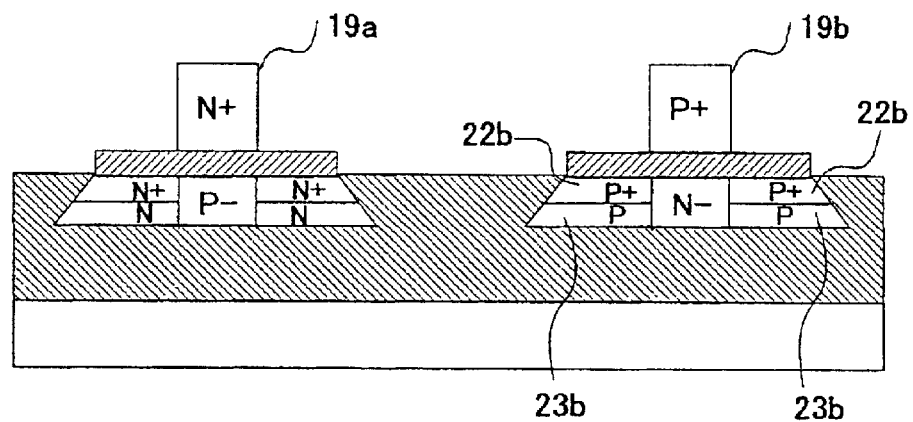
Figure 14F:
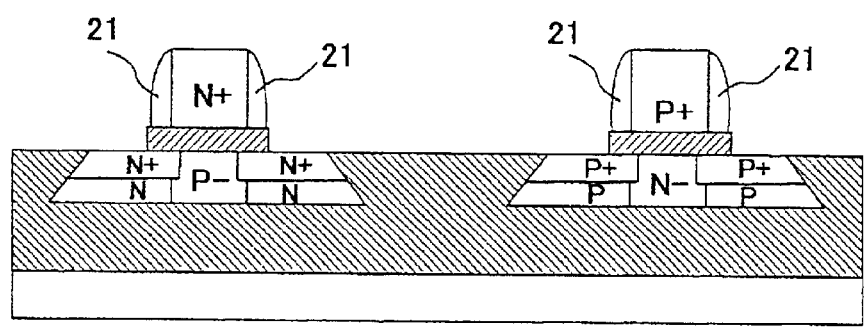

Next, based upon a similar principle applied to the formation of the nMOSFET, a shallow S/D $22b$ and a deep S/D $23b$ are formed at the pMOS area with $BF_2$ (FIG. 14(E)).

In the following step, an $SiO_2$ film, an SiN film or a compound film achieved by combining an $SiO_2$ film and an SiN film is formed over a thickness of 50 nm through a CVD method and then an etch-back is performed through reactive ion etching (RIE) to form sidewalls 21. A heat treatment is performed at a relatively low temperature of, for instance, 950° C. over a 10 second period through RTA. The positions at which the sources•drains having undergone the heat treatment and the body areas are joined are set further toward the bottoms of the gates, since the high impurity concentration at the shallow sources drains results in a large range over which diffusion occurs along the horizontal direction during the heat treatment. However, the extent of horizontal diffusion at deeper areas is still reduced compared to the extent of diffusion occurring at the deep sources•drains manifesting a high concentration over the entire sources•drains (FIG. 14(F)).

Figure 14G:
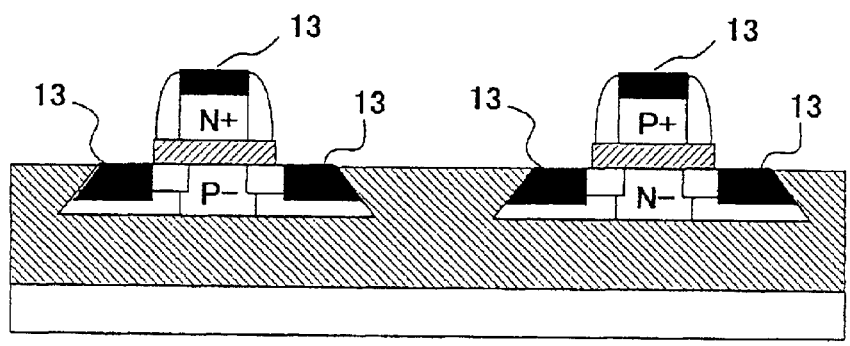

Then, a Co silicide process is performed to form a Co silicide 13 on the sources•drains 12 and the gate electrodes $19a$ and $19b$, thereby completing the formation of a fully depleted SOI CMOSFET (FIG. 14(G)).

(Advantages Achieved in Tenth Embodiment)

As explained above, through the SOI MOSFET manufacturing method achieved in the tenth embodiments, an SOI MOSFET which does not manifest fluctuations in the characteristics due to inconsistency in the sidewall film thickness and achieves a smaller channel length while further suppressing the adverse short channel effect compared to the eighth and ninth embodiments is realized by implementing the source•drain ion implantation twice, the first time at a low energy level achieving a high concentration and the second time at a higher energy level achieving a low concentration.

In addition, by forming shallow sources•drains with a high concentration of $10^{20}$ $cm^{-3}$ or higher, the extent of the horizontal diffusion occurring at the sources•drains at deep positions is suppressed, thereby achieving an advantage in that the adverse short channel effect is lessened compared to the extent to which it manifests when the impurities are highly concentrated over the entire sources drains. Furthermore, by injecting the source•drain impurities at deeper positions, any longitudinal pn junction that might otherwise manifest at the sources•drains is eliminated, so as to prevent the occurrence of a leak current between the sources•drains after the Co silicide process.

(Eleventh Embodiment)

Figure 15D:
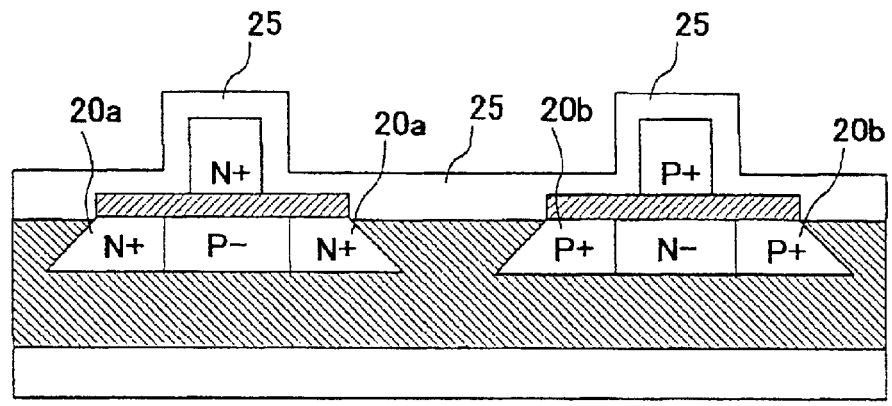
FIGS. 15(D)–15(F) illustrate the method achieved in an eleventh embodiment of the present invention.
Figure 15E:
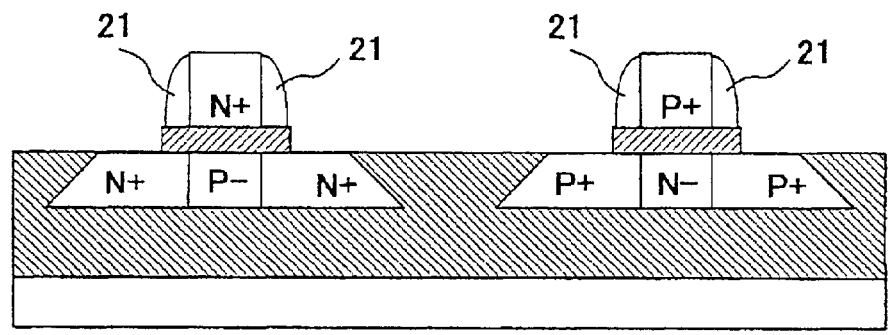

FIG. 15 presents schematic sectional views provided to facilitate the explanation of the field effect transistor manufacturing method achieved in the eleventh embodiment of the present invention. While the sectional views on the left side are each taken along the direction perpendicular to the gate electrode at the transistor portion, the sectional views on the right side are each taken across the center of the gate electrode along line a–b in the figure on the left side. Since steps in the eleventh embodiment corresponding to FIGS. 12(A) through 12(C) are implemented in the eighth embodiment, their explanation is omitted.

In the following step, after forming an $SiO_2$ film or an SiN film 25 over a thickness of 10~30 nm through a CVD method, ions of As and $BF_2$ are implanted into the nMOS area and the pMOS area to form an nMOSFET S/D $20a$ and a pMOSFET S/D $20b$. The level of the energy used in this process should be set so as to allow all the impurities to be injected into the silicon layer 3 constituting the sources•drains with a small thickness with the dose set so as to achieve an impurity concentration of at least $10^{20}$ $cm^{-3}$ at the sources•drains (FIG. 15(D)).

Next, an $SiO_2$ film or an SiN film is formed over a thickness of 40 nm through a CVD method and sidewalls 21 are formed by performing an etch-back through reactive ion etching (RIE). Subsequently, a heat treatment is performed at a relatively low temperature of, for instance, 950° C. over a period of 10 seconds on a rapid thermal annealing apparatus (RTA) (FIG. 15(E)).

Figure 15F:
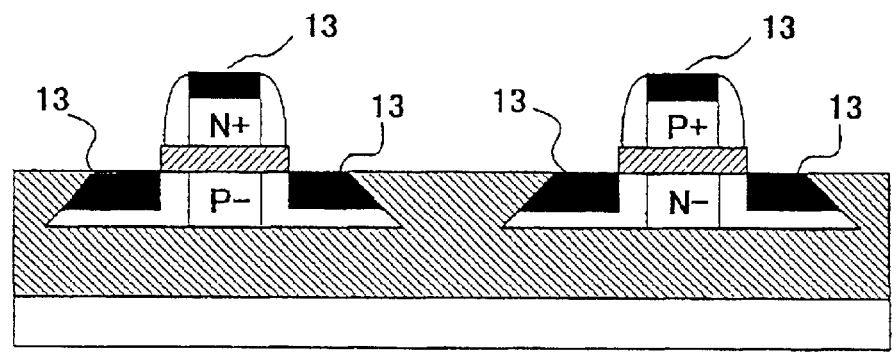

Then, a Co silicide process is performed to form a Co silicide 13 the sources•drains and the gates, thereby completing the formation of a fully depleted SOI CMOSFET (FIG. 15(F)).

(Advantages Achieved in Eleventh Embodiment)

As explained above, through the SOI MOSFET manufacturing method achieved in the eleventh embodiment, an SOI MOSFET which does not manifest fluctuations in the characteristics due to inconsistency in the sidewall film thickness and achieves a short channel length while further suppressing the adverse short channel effect compared to the eighth and ninth embodiments is realized by implementing the source•drain ion implantation after forming a thin sidewall film.

In the related art in which the source•drain ion implantation is performed after forming sidewalls with a large thickness of approximately 1000 Å, inconsistency in the film thickness tends to be more pronounced to result in inconsistent transistor characteristics.

However, in the eleventh embodiment in which the extent to which diffusion occurs along the horizontal direction at the sources•drains is lessened by lowering the temperature at which the heat treatment is performed and also by lowering the impurity concentration, the film thickness of the sidewalls can be reduced by 100 Å~200 Å. As a result, the extent of inconsistency in the film thickness is reduced, and furthermore, any inconsistency in the film thickness that might occur during the etching process is eliminated by implementing the ion implantation prior to the sidewall etching process. Moreover, since the reduced film thickness at the side walls reduces the difference between the range of over which the impurity is diffused at the nMOS and length over which the impurity is diffused at the pMOS, the sidewall film thickness can be set with accuracy and ease.

Another advantage achieved by implementing the source•drain ion implantation following the sidewall film formation as in the embodiment is that while the thickness of the silicon layer at the sources•drains becomes reduced if an ashing process and an HF process are implemented as post-treatments after the ion implantation, the silicon layer remains intact at the sources•drains in the embodiment. The smaller the thickness of the silicon layer, the more difficult it becomes to lower the resistance through the Co silicide process. While this may result in an etch-through occurring during the contact etching process, such a problem can be avoided by adopting the embodiment.

(Twelfth Embodiment)

FIG. 16 presents schematic sectional views provided to facilitate the explanation of the field effect transistor manufacturing method achieved in the twelfth embodiment of the present invention. While the sectional views on the left side are each taken along the direction perpendicular to the gate electrode at the transistor portion, the sectional views on the right side are each taken across the center of the gate electrode along line a–b in the figure on the left side. Since steps in the twelfth embodiment corresponding to FIGS. 12(A) through 12C are implemented in the eighth embodiments, their explanation is omitted.

In the following step, ions of As and P are implanted into the entire surface without implementing a photolithography process. The dose should be set for the ion implantation so as to achieve an impurity concentration of approximately $10^{18}$~$10^{19}$ cm$^{-3}$ in the SOI. As a result, N layers 24 are formed to constitute an nMOSFET S/D and a pMOSFET S/D (FIG. 16(D)).

Figure 16D:
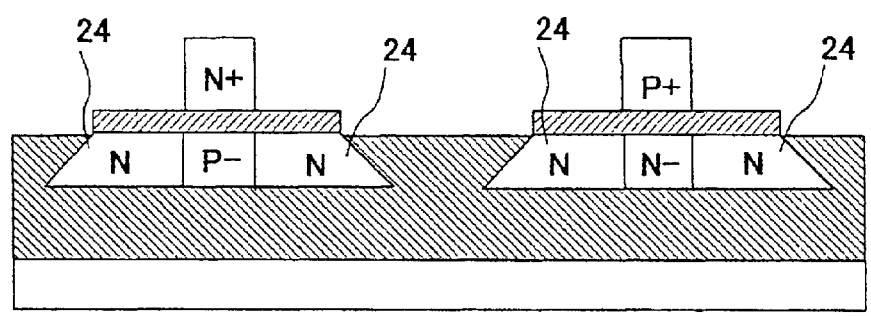
FIGS. 16(D)–16(G) illustrate the method achieved in a twelfth embodiment of the present invention.
Figure 16E:
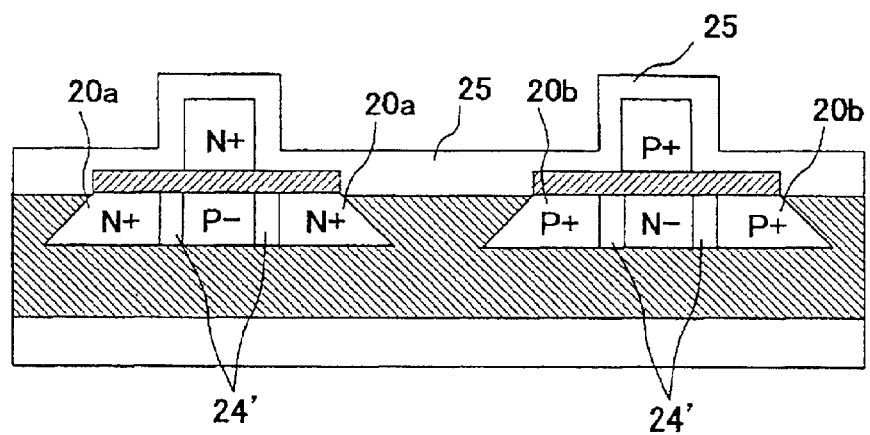

Then, after forming an SiO$_2$ film or an SiN film 25 over a thickness of 10~30 nm through a CVD method, ions of As and BF$_2$ are implanted into the nMOS area and the pMOS area to form an nMOSFET S/D 20a and a pMOSFET S/D 20b. The level of the energy used in this process should be set so as to allow all the impurities to be injected into the silicon layer 3 constituting the sources•drains with a small thickness with the dose set so as to achieve an impurity concentration of at least $10^{20}$ cm$^{-3}$ at the sources•drains. The film thickness of the SiO$_2$ film or SiN film 25 should be set so as to ensure that the pMOSFET does not become offset. In addition, N layer 24' formed during the previous step are present between the nMOSFET S/D 20a and the body area 8 and the pMOSFET S/D 20b and the body area 8. The N layer 24' at the nMOS function as an LDD, whereas the N layer 24' functions as a halo at the pMOS (FIG. 16E).

Next, an SiO$_2$ film or an SiN film is formed over a thickness of 40 nm through a CVD method and sidewalls 21 are formed by performing an etch-back through reactive ion etching (RIE).

Figure 16F:
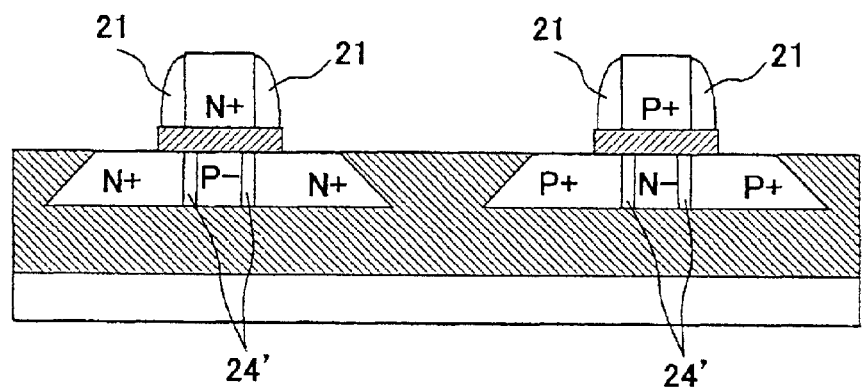

Subsequently, a heat treatment is performed at a relatively low temperature of, for instance, 950° C. over a period of 10 seconds through RTA (FIG. 16(F)).

Figure 16G:
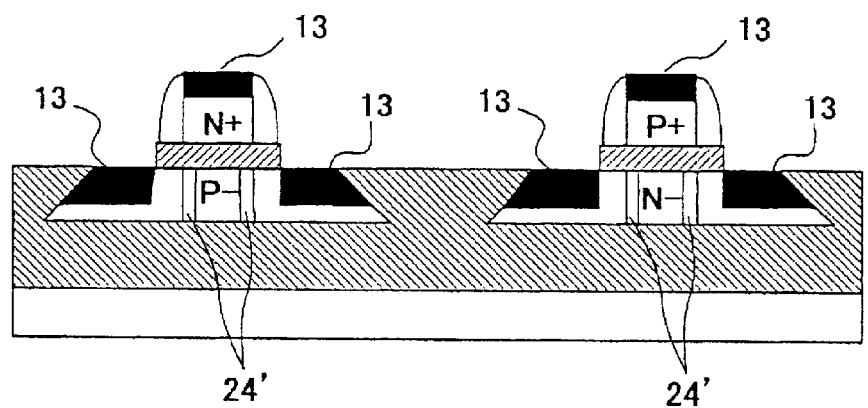
Figure 17:
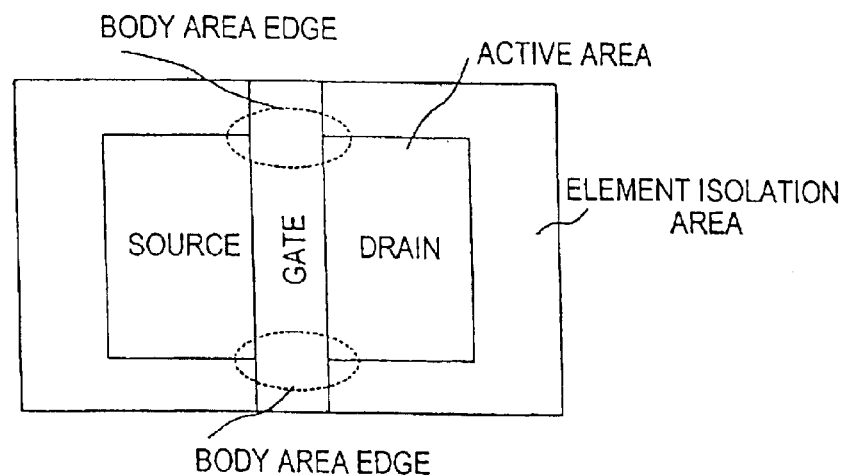
FIG. 17 illustrates the relationship between the gate electrode and the body area where the source•drain are formed in a view taken from above the element.
Figure 18:
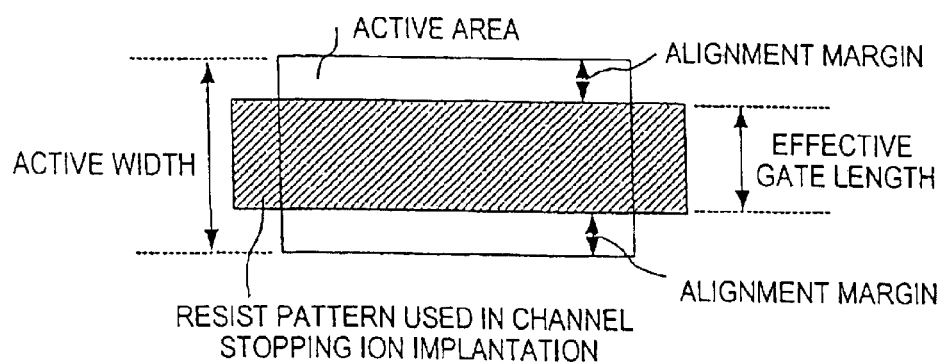
FIG. 18 illustrates the relationship between the active area and the resist pattern provided for channel stopping implantation.
Figure 19:
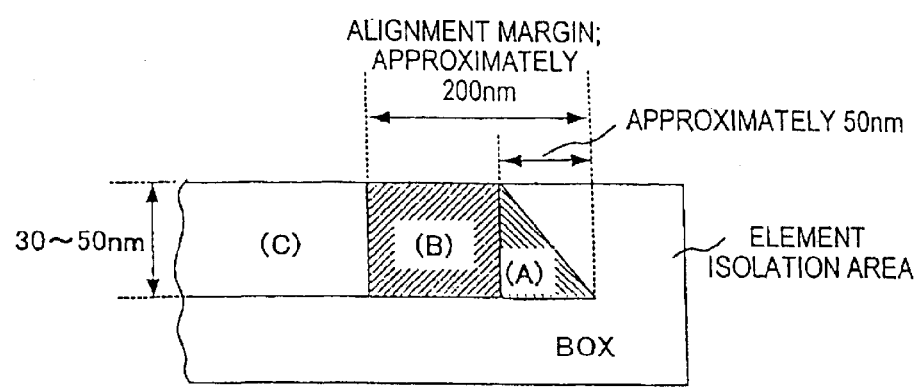
FIG. 19 presents a sectional view of an element formed on an SOI substrate showing an area (A) where channel stopping is required, an area (B) where channel stopping is not required and an area (C) where channel stopping ion implantation has not been implemented.
Figure 20:
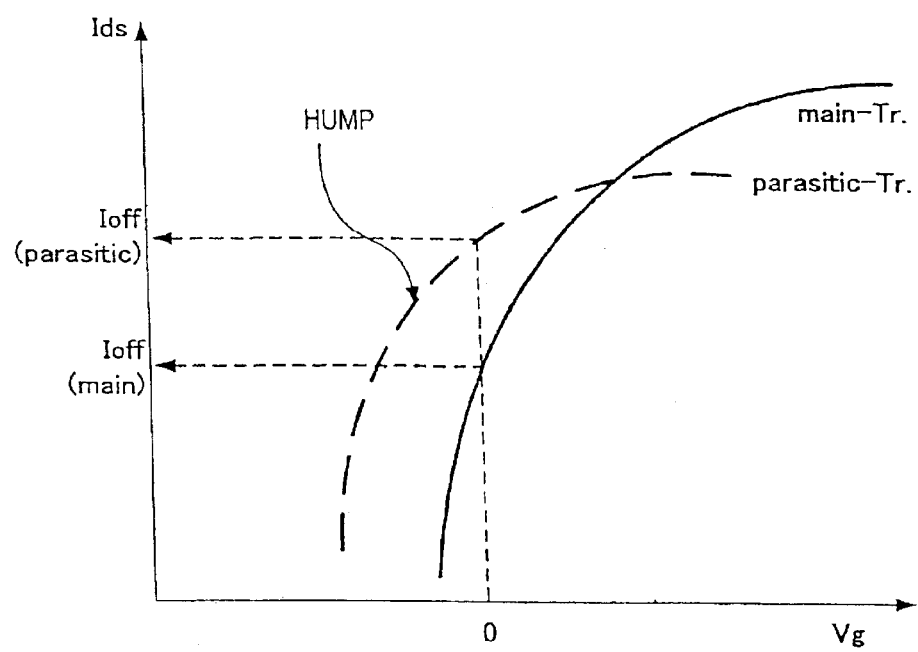
FIG. 20 shows the hump characteristics manifesting in a MOSFET manufactured in a related art method, with the vertical axis representing the drain current (Ids), the horizontal axis representing the gate voltage (Vg), the solid line representing the main transistor characteristics and the dotted line representing the parasitic transistor characteristics.

Then, a Co suicide process is performed to form a Co silicide 13 on the sources•drains 12 and the gate electrodes, thereby completing the formation of a fully depleted SOI CMOSFET (FIG. 16(G)).

(Advantages Achieved in Twelfth Embodiment)

As explained above, through the SOI MOSFET manufacturing method achieved in the twelfth embodiment, an SOI MOSFET which allows the suppression of the short channel effect to be controlled at the nMOS and the pMOS independently of each other unlike in the eighth through eleventh embodiments, does not manifest fluctuations of characteristics due to inconsistency in the sidewall film thickness and achieves a small channel length is realized by implanting ions to form the LDD at the nMOS and the halo at the pMOS through a single injection without implementing a photolithography process and by implementing the source•drain ion implantation after forming a sidewall film with a small thickness.

The eighth through eleventh embodiments are achieved on the premise that there is hardly any difference in the extent to which the short channel effect manifests at the nMOS and the pMOS. Thus, the advantages of the twelfth embodiment are further enhanced when there is a significant difference in the extent of the short channel effect manifesting at the nMOS and the pMOS in a MOSFET with a smaller gate length. Since the type of impurity seed used to constitute the pMOS makes the pMOS more vulnerable to the adverse short channel effect than the nMOS, the first sidewall film is formed over a film thickness which does not allow an offset from occurring between the gate and the source•drain at the pMOS. In this situation, since the length over which the impurity becomes diffused along the horizontal direction is small at the nMOS, a slight offset occurs at the nMOS. By implanting ions of an N-type impurity over the entire surface achieving a concentration equivalent to the concentration at the LDD structure, an LDD structure is achieved instead of an offset at the nMOS, and a halo structure is achieved at the pMOS, thereby lessening the adverse short channel effect. This realizes an additional advantage in that the manufacturing process is simplified by replacing the two photolithography processes and the two ion implantation processes implemented in the related art, i.e., the nMOS LDD photolithography process, the nMOS LDD ion implantation process, the pMOS halo photolithography process and the pMOS halo ion implantation process, with the single ion implantation.

It goes without saying that the twelfth embodiment also achieves the advantages similar to those achieved in the eleventh embodiment.

While a SIMOX wafer is used as the substrate in the explanation of the first through twelfth embodiments given above, the present invention is not limited to this example, and it may be a adopted in conjunction with a laminated SOI substrate or in conjunction with a standard bulk silicon wafer. In addition, the thickness of the buried oxide film, the thickness of the silicon layer and the like are not limited to the examples presented in the embodiments and similar advantages are achieved by using the buried oxide film and the silicon layer having varying thicknesses. Furthermore, the dimensions of the field effect transistor, the temperature at which the heat treatment is performed and the length of time over which the heat treatment is performed are not limited to the examples presented in the embodiments, either.

While the invention has been particularly shown and described with respect to preferred embodiments of the field effect transistor manufacturing method according to the present invention by referring to the attached drawings, the present invention is not limited to these examples and it will be understood by those skilled in the art that various changes in form and detail may be made therein without departing from the spirit, scope and teaching of the invention.

What is claimed is:

1. A method for manufacturing a field effect transistor comprising:

providing an SOI substrate having a silicon layer formed on an insulating layer;

forming an active nitride film formed on the SOI substrate;

patterning the active nitride for form a mask;

forming a field oxide film for element isolation with the mask;

wet-etching the mask until the film thickness thereof is reduced to allow an edge of the silicon layer contacting the field oxide film to be exposed;

implanting ions of a channel stopping impurity into the edge of the silicon layer by using the wet-etched mask; and forming a gate electrode, a source and drain on the SOI substrate.

2. A method for manufacturing a field effect transistor according to claim 1, comprising implanting ions of the channel stopping impurity vertically into the edge of the silicon layer.

3. A method for manufacturing a field effect transistor according to claim 1, comprising implanting ions of the channel stopping impurity at an angle into the edge of the silicon layer.

4. A method for manufacturing a field effect transistor according to claim 3, wherein the film thickness of the active nitride film is adjusted during the ion implantation in correspondence to the angle at which the ions are implanted.

5. A method for manufacturing a field effect transistor according to claim 1, further comprising:
implementing a heat treatment on the SOI substrate after implanting ions of the channel stopping impurity.

6. A method for manufacturing a field effect transistor according to claim 1, further comprising:
forming a sidewall constituted of a nitride film before forming the field oxide film for element isolation.

7. A method for manufacturing a field effect transistor according to claim 1, further comprising:
forming a silicon oxide film on an area where the edge of the silicon layer is exposed after wet-etching the mask.

8. A method for manufacturing a field effect transistor according to claim 1, further comprising:
forming a silicon oxide film on an area where the edge of the silicon layer is exposed after implanting the ions of said channel stopping impurity.

9. A method for manufacturing a field effect transistor according to claim 1, further comprising:
forming a sidewall constituted of a silicon oxide film at a side surface of the active nitride film after implanting the ions of said channel stopping impurity.

10. A method for manufacturing a field effect transistor according to claim 1, further comprising:
forming a sidewall constituted of a polysilicon film at a side surface of the active nitride film;
oxidizing the sidewall constituted of the polysilicon film after implanting the ions of said channel stopping impurity.

11. A method for manufacturing a field effect transistor comprising:
providing an SOI substrate having a silicon layer formed on an insulating layer;
forming a gate electrode by etching a conductive layer formed on the silicon layer;
implanting ions to form a source and drain at an energy level at which all the impurity is injected into the silicon layer constituting the source and drain; and
implementing a heat treatment at a low temperature under 950° C. in order to activate the impurity at the source and drain;
wherein ions are implanted twice to form said source and drain, once at a low energy level achieving a high concentration and another time at a high energy level achieving a low concentration.

12. A method for manufacturing a field effect transistor comprising:
providing an SOI substrate having a silicon layer formed on an insulating layer;
forming a gate electrode by etching a conductive layer formed on the silicon layer;
implanting ions to form a source and drain at an energy level at which all the impurity is injected into the silicon layer constituting the source and drain; and
implementing a heat treatment at a low temperature under 950° C. in order to activate the impurity at the source and drain;
wherein ions are implanted twice to form said source and drain, once at a low energy level achieving a high concentration and another time at a high energy level achieving a low concentration;
wherein the impurity concentration near the surface of said silicon layer is set equal to or higher than $10^{20}$ cm$^{-3}$ through the ion implantation implemented at the low energy level achieving the high concentration with the impurity concentration becoming lower toward the rear surface of said silicon layer.

13. A method for manufacturing a field effect transistor comprising:
providing an SOI substrate having a silicon layer formed on an insulating layer;
forming a gate electrode by etching a conductive layer formed on the silicon layer;
implanting ions to form a source and drain at an energy level at which all the impurity is injected into the silicon layer constituting the source and drain; and
implementing a heat treatment at a low temperature under 950° C. in order to activate the impurity at the source and drain;
wherein ions are implanted twice to form said source and drain, once at a low energy level achieving a high concentration and another time at a high energy level achieving a low concentration;
wherein the impurity concentration near the rear surface of said silicon layer is set higher than the channel concentration and equal to or lower than $10^{19}$ cm$^{-3}$ through the ion implantation implemented at the high energy level achieving the low concentration.

14. A method for manufacturing a field effect transistor comprising:
providing an SOI substrate having a silicon layer formed on an insulating layer;
forming a gate electrode by etching a conductive layer formed on the silicon layer;
implementing ions to form a source and drain at an energy level a which all the impurity is injected into the silicon layer constituting the source and drain; and
implementing a heat treatment at a low temperature under 950° C. in order to activate the impurity at the source and drain;
wherein ions are implanted twice to form said source and drain, once at a low energy level achieving a high concentration and another time at a high energy level achieving a low concentration;
wherein the impurity concentration near the rear surface of said silicon layer is set higher than the channel concentration and equal to or lower than $10^{19}$ cm$^{-3}$ through the ion implantation implemented at the high energy level achieving the low concentration;
wherein the impurity concentration near the surface of said silicon layer is sets equal to or higher than $10^{20}$ cm$^{-3}$ through the ion implantation implemented at the low energy level achieving the high concentration with the impurity concentration becoming lower toward the rear surface of said silicon layer.

* * * * *